US012707799B2

(12) United States Patent
Cha et al.

(10) Patent No.: US 12,707,799 B2
(45) Date of Patent: Aug. 11, 2026

(54) ELECTROLUMINESCENT DEVICE INCLUDING SEMICONDUCTOR NANOCRYSTAL AND CYANIDE GROUP AND DISPLAY DEVICE INCLUDING THE SAME

(71) Applicant: Samsung Electronics Co., Ltd., Suwon-si (KR)

(72) Inventors: Soonmin Cha, Suwon-si (KR); Wonsik Yoon, Suwon-si (KR); Eun Joo Jang, Suwon-si (KR); Taehyung Kim, Suwon-si (KR); Hyo Sook Jang, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 534 days.

(21) Appl. No.: 17/991,017

(22) Filed: Nov. 21, 2022

(65) Prior Publication Data

US 2023/0165027 A1 May 25, 2023

(30) Foreign Application Priority Data

Nov. 23, 2021 (KR) ........................ 10-2021-0162681

(51) Int. Cl.

*H10K 50/115* (2023.01)
*H10K 50/15* (2023.01)
*H10K 50/16* (2023.01)
*H10K 50/17* (2023.01)
*H10K 71/00* (2023.01)

(52) U.S. Cl.

CPC ........... *H10K 50/115* (2023.02); *H10K 50/15* (2023.02); *H10K 50/16* (2023.02); *H10K 50/171* (2023.02); *H10K 71/00* (2023.02)

(58) Field of Classification Search

None

See application file for complete search history.

(56) References Cited

U.S. PATENT DOCUMENTS 9,334,440 B2 5/2016 Jang et al.
9,834,724 B2 12/2017 Kim et al.

(Continued)

FOREIGN PATENT DOCUMENTS

CN 109935718 B 8/2020
CN 109935665 B 11/2020

(Continued)

OTHER PUBLICATIONS

Angeles Touceda-Varela et al., "Selective turn-on fluorescence detection of cyanide in water using hydrophobic CdSe quantum dotsw," Chem. Commun., Feb. 26, 2008, pp. 1998-2000.

(Continued)

*Primary Examiner* — Daniel Whalen

(74) *Attorney, Agent, or Firm* — CANTOR COLBURN LLP

(57) ABSTRACT

An electroluminescent device including a first electrode; a second electrode; and a light emitting layer disposed between the first electrode and the second electrode, wherein the light emitting layer includes a plurality of semiconductor nanoparticles and does not include cadmium, wherein the light emitting layer further includes a chemical species including a cyanide group including a cyano group, a cyanide anion, or a combination thereof, and wherein the chemical species includes a bond between a metal and the cyanide group.

14 Claims, 5 Drawing Sheets

(56) References Cited

U.S. PATENT DOCUMENTS

| | | | |
|---|---|---|---|
| 10,424,695 B2 | 9/2019 | Won et al. | |
| 10,961,446 B2 | 3/2021 | Kim et al. | |
| 11,050,033 B2 | 6/2021 | Kim et al. | |
| 11,063,231 B2 | 7/2021 | Chung et al. | |
| 11,316,079 B2 | 4/2022 | Won et al. | |
| 11,618,851 B2 | 4/2023 | Hyung | |
| 2019/0280233 A1* | 9/2019 | Kim | H10K 85/151 |
| 2021/0403804 A1 | 12/2021 | Jeon et al. | |

FOREIGN PATENT DOCUMENTS

| | | | |
|---|---|---|---|
| CN | 112011328 | A | * 12/2020 |
| JP | 2021005479 | A | 1/2021 |
| KR | 20140075038 | A | 6/2014 |
| KR | 20150034621 | A | 4/2015 |
| KR | 20180068893 | A | 6/2018 |
| KR | 20200039605 | A | 4/2020 |
| KR | 102156760 | B1 | 9/2020 |
| KR | 102184401 | B1 | 11/2020 |
| KR | 20210039178 | A | 4/2021 |
| KR | 20210070464 | A | 6/2021 |
| KR | 20210089442 | A | 7/2021 |

OTHER PUBLICATIONS

Office Action dated May 8, 2025 of the corresponding Korean Patent Application No. 10-2021-0162681.

Notice of Allowance dated Nov. 24, 2025 of the corresponding Korean Patent Application No. 10-2021-0162681.

* cited by examiner

AC-3 (Cyanide Salt)

Untreated

KCN treated

Yield^0.33 (cps)

15 13 11 9 7 5 3 1 -1

4.5 5 5.5 6 6.5

Energy (eV)

ELECTROLUMINESCENT DEVICE INCLUDING SEMICONDUCTOR NANOCRYSTAL AND CYANIDE GROUP AND DISPLAY DEVICE INCLUDING THE SAME

CROSS-REFERENCE TO RELATED APPLICATION

This application claims priority to Korean Patent Application No. 10-2021-0162681 filed in the Korean Intellectual Property Office on Nov. 23, 2021, and all the benefits accruing therefrom under 35 U.S.C. § 119, the content of which in its entirety is herein incorporated by reference.

BACKGROUND

1. Field

The present disclosure relates to an electroluminescent device including a semiconductor nanoparticle and a display device including the same.

2. Description of the Related Art

A semiconductor nanoparticle (e.g., a semiconductor nanocrystal particle) having a nanometer size may emit light. For example, a semiconductor nanoparticle including a semiconductor nanocrystal may exhibit a quantum confinement effect, and thereby, demonstrate luminance properties. For example, light emission from the semiconductor nanoparticle may occur when an electron in an excited state resulting from light excitation or an applied voltage transitions from a conduction band to a valence band. The semiconductor particle may be configured to emit light of a desired wavelength region by adjusting a size of the semiconductor nanoparticle, a composition of the semiconductor nanoparticle, or a combination thereof.

Semiconductor nanoparticles may be used in, for example, an electroluminescent device (e.g., an electroluminescent light emitting device) or a display device.

SUMMARY

An embodiment provides a luminescent device that emits light, for example, by applying a voltage to nanostructures (e.g., nanoparticles such as semiconductor nanoparticles).

An embodiment provides a self-luminescent type display device capable of providing a picture on a screen without a separate light source.

An embodiment provides a display device (e.g., a quantum dot (QD)-light emitting diode (LED) display) that includes a nanoparticle such as a semiconductor nanoparticle) as a light emitting material in a configuration of a blue pixel, a red pixel, a green pixel, or a combination thereof.

In an embodiment, an electroluminescent device includes:

a first electrode and a second electrode spaced apart from each other (e.g., each electrode having a surface opposite the other), and a light emitting layer disposed between the first electrode and the second electrode, wherein the light emitting layer includes a plurality of semiconductor nanoparticles, and the plurality of semiconductor nanoparticles does not include cadmium, wherein the light emitting layer further includes a cyanide anion, a chemical species including a cyanide moiety, or a combination thereof, and wherein the chemical species includes a bond between a metal and the cyanide group.

The electroluminescent device may further include an electron auxiliary layer disposed between the light emitting layer and the second electrode, wherein the electron auxiliary layer may inject, transport or inject and transport the electrons.

The electroluminescent device may further include a hole auxiliary layer between the light emitting layer and the first electrode. The hole auxiliary layer may include a hole transport layer (e.g., including an organic compound), a hole injection layer, or a combination thereof.

The electron auxiliary layer may include an electron transport layer.

The electron auxiliary layer or the electron transport layer may include a zinc magnesium oxide nanoparticle.

The semiconductor nanoparticle may include a Group II-VI compound, a Group III-V compound, a Group IV-VI compound, a Group IV element or compound, a Group I-III-VI compound, a Group II-III-VI compound, a Group I-II-IV-VI compound, or a combination thereof.

A size of the semiconductor nanoparticle may be greater than or equal to about 2 nanometers (nm).

A size of the semiconductor nanoparticle may be less than or equal to about 50 nm.

In an embodiment, the chemical species may not include a nitrile compound wherein the cyano group is linked to a carbon atom via a covalent bond.

The light emitting layer may include an alkali metal cyanide, an ammonium salt cyanide, a hydrogen cyanide, a cyanide group derived therefrom, or a combination thereof.

The light emitting layer may exhibit a, e.g., at least one, peak that may be assigned to a cyanide group in a wavenumber range of about 1,900 inverse centimeters ($cm^{-1}$) and about 2,300 $cm^{-1}$ in a Fourier transform infrared spectroscopy analysis.

The peak assigned to the cyanide group may include a first peak, a second peak, or a combination thereof.

The first peak may be present in a wavenumber range of about 2,000 $cm^{-1}$ to about 2,150 $cm^{-1}$ or about 2,000 $cm^{-1}$ to about 2,140 $cm^{-1}$.

The second peak may be present in a wavenumber range of about 2,100 $cm^{-1}$ to about 2,300 $cm^{-1}$ or about 2,150 $cm^{-1}$ to about 2,230 $cm^{-1}$.

The second peak may be at a wavenumber higher than the first peak.

The light emitting layer may further include an organic ligand.

The organic ligand may be bonded to a surface of the semiconductor nanoparticle.

The organic ligand may include, RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, or a combination thereof, wherein R and R' are each independently a substituted or unsubstituted C1 to C40 aliphatic hydrocarbon, a substituted or unsubstituted C6 to C40 aromatic hydrocarbon, or a combination thereof. A mixture of two or more different ligands may be used.

The light emitting layer or the organic ligand may further include a chemical species including a COO moiety.

The chemical species including a COO moiety may include a C5 to C40 aliphatic organic ligand (e.g., a fatty acid). The aliphatic organic ligand may include a $C_{10-50}$ alkyl group, a $C_{10-50}$ alkenyl group, a $C_{10-50}$ alkynyl group, or a combination thereof.

The aliphatic organic ligand may include caprylic acid, capric acid, lauric acid, myristic acid, palmitic acid, stearic acid, arachidic acid, behemic acid, lignoceric acid, cerotic acid, myristoleic acid, palmitoleic acid, sapienic acid, oleic acid, elaidic acid, vaccenic acid, linoleic acid, linoelaidic acid, α-linolenic acid, arachidonic acid, eicosapentaenoic acid, erucic acid, docosahexaenoic, or a combination thereof.

The light emitting layer may exhibit a peak assigned to a COO moiety in a wavenumber range of about 1,400 $cm^{-1}$ to about 1,650 $cm^{-1}$ in a Fourier transform infrared spectroscopy analysis.

In the light emitting layer, a ratio of a normalized intensity of the peak assigned to the cyanide group to a normalized intensity of the peak assigned to the COO moiety may be greater than or equal to about 0.03:1, or greater than or equal to about 0.05:1 and less than or equal to about 1:1.

The semiconductor nanoparticles may include a zinc chalcogenide.

The semiconductor nanoparticles may further include an organic ligand for example on a surface thereof and in the light emitting layer, and in the semiconductor nanoparticles a mole ratio of carbon to zinc may be greater than or equal to about 1.5:1 and less than or equal to about 4:1.

In the light emitting layer, a mole ratio of carbon to zinc may be greater than or equal to about 1.8:1, greater than or equal to about 2:1, or greater than or equal to about 2.3:1.

In the light emitting layer, a mole ratio of carbon to zinc may be less than or equal to about 3.5:1, or less than or equal to about 2.8:1.

In the light emitting layer, a mole ratio of chlorine to zinc may be less than or equal to about 0.15:1, or less than or equal to about 0.1:1.

The electroluminescent device may further include an electron auxiliary layer disposed between the light emitting layer and the second electrode, and a difference between a lowest unoccupied molecular orbital (LUMO) energy level of the light emitting layer and a LUMO energy level of the electron auxiliary layer may be greater than or equal to about 0.001 electronvolts (eV), greater than or equal to about 0.05 eV, or greater than or equal to about 0.1 eV.

A difference between the LUMO energy level of the light emitting layer and the LUMO energy level of the electron auxiliary layer may be less than or equal to about 0.9 eV, less than or equal to about 0.8 eV, or less than or equal to about 0.6 eV.

The electroluminescent device may be configured to emit red light, green light or blue light.

The electroluminescent device may exhibit a maximum external quantum efficiency of greater than or equal to about 6%, or greater than or equal to about 10% and less than or equal to about 40%.

The electroluminescent device may exhibit a maximum luminance of greater than or equal to about 50,000 nit (candelas per square meter or $cd/n^2$), greater than or equal to about 60,000 nit, greater than or equal to about 80,000 nit, or greater than or equal to about 100,000 nit.

The electroluminescent device may exhibit a T50 of greater than or equal to about 50 hours, greater than or equal to about 80 hours, greater than or equal to about 100 hours, or greater than or equal to about 120 hours, as measured by operating the device at a predetermined luminance (e.g., 2,800 nit or 650 nit).

The electroluminescent device may exhibit a delta voltage value of less than 1 volt, or less than or equal to about 0.5 volt at T50.

In an embodiment, a method of producing the electroluminescent device includes forming the light emitting layer on the first electrode, forming the electron auxiliary layer on the light emitting layer; and forming the second electrode on the electron auxiliary layer, wherein the formation of the light emitting layer includes preparing a film including semiconductor nanoparticles, and contacting the semiconductor nanoparticles with a cyanide solution to produce the electroluminescent device. The cyanide solution may be prepared by dissolving a cyanide compound (e.g., an inorganic cyanide) in a solvent (e.g., an organic solvent). The contact may be carried out prior to the formation of the film. The contact may be carried out after the formation of the film.

In an embodiment, a method of producing an electroluminescent device includes forming a light emitting layer on the first electrode, and forming a second electrode on the light emitting layer, wherein forming the light emitting layer includes preparing a film including semiconductor nanoparticles, and contacting the semiconductor nanoparticles with a cyanide solution to produce the electroluminescent device.

The formation of the light emitting layer may include preparing the cyanide solution, applying the cyanide solution on the film, and removing the solution from the film.

The formation of the light emitting layer may include preparing the cyanide solution, mixing the cyanide solution with a dispersion including the semiconductor nanoparticles to contact the semiconductor nanoparticles with the cyanide solution, and forming the film including the semiconductor nanoparticles contacted with the cyanide solution.

The cyanide compound may include an alkali metal cyanide, an ammonium salt cyanide, a hydrogen cyanide, or a combination thereof.

The chemical species or the cyanide compound may include potassium cyanide (KCN), sodium cyanide (NaCN), lithium cyanide (LiCN), rubidium cyanide (RbCN), cesium cyanide (CsCN), a tetraalkyl ammonium salt cyanide, or a combination thereof.

In an embodiment, a display device or display panel may include the electroluminescent device.

In an embodiment, a display device may include a light emitting layer, wherein the light emitting layer includes a plurality of semiconductor nanoparticles and does not comprise cadmium, and wherein the light emitting layer further includes a cyanide anion, a chemical species comprising a cyanide group that may be linked to a metal, or a combination thereof.

The display device (panel) may include a first pixel and a second pixel, wherein the second pixel is configured to emit light different from light emitted from the first pixel, The display device or an electronic device may include (or may be) a handheld terminal, a monitor, a notebook computer, a television, an electronic display board, a camera, a part for an automatic, e.g., autonomous, vehicle.

In an embodiment, a semiconductor device includes electrodes spaced from each other, and an active layer disposed between the electrodes and including the semiconductor nanoparticles and the chemical species.

According to an embodiment, the electroluminescent device may exhibit both increased electroluminescent properties and a desired or improved lifespan (e.g., a T50 value or a T50 voltage difference). According to an embodiment, the electroluminescent device may provide improved displaying quality in a display device.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
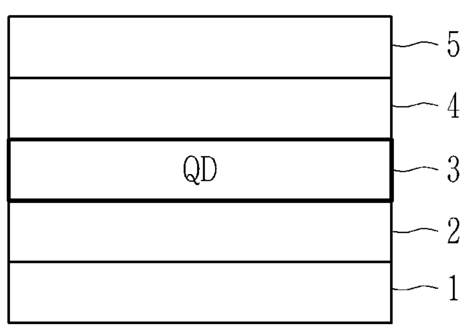
FIG. 1 is a schematic cross-sectional view of a light-emitting device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

In order to dearly explain the present disclosure, parts irrelevant to the description are omitted, and the same reference numerals are assigned to the same or similar elements throughout the specification.

The size and thickness of each constituent element as shown in the drawings are indicated for better understanding and ease of description, and this disclosure is not necessarily limited to sizes or thicknesses as shown. In the drawings, the thickness of layers, films, panels, regions, etc., are exaggerated for clarity. And in the drawings, for convenience of description, the thickness of some layers and regions are exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as being limited to "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, the term "cross-sectional phase" means a case in which a cross-section of a given object is cut, for example, in a substantially vertical direction and is viewed laterally.

Unless otherwise defined, all terms (including technical and scientific terms) used herein have the same meaning as commonly understood by one of ordinary skill in the art to which this disclosure belongs. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

As used herein, the upper and lower endpoints set forth for various numerical values may be independently combined to provide a range.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5%, ±3%, or ±1% of the stated value.

As used herein, the term "Group" may refer to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group IIIA metal may be Al, In, Ga, and TI, and examples of Group IIIB may be scandium, yttrium, or the like, but are not limited thereto.

As used herein, "Group IV" refers to Group IVA and Group IVB, and examples of a Group IVA metal may be Si, Ge, and Sn, and examples of Group IVB metal may be titanium, zirconium, hafnium, or the like, but are not limited thereto.

As used herein, "Group V" includes Group VA and includes nitrogen, phosphorus, arsenic, antimony, and bismuth, but is not limited thereto.

As used herein, "Group VI" includes Group VIA and includes sulfur, selenium, and tellurium, but is not limited thereto.

As used herein, "metal" includes a semi-metal such as Si.

As used herein, the average (value) may be mean or median. In an embodiment, the average (value) may be a mean average.

As used herein, a number of carbon atoms in a group or a molecule may be referred to as a subscript (e.g., $C_{6-50}$) or as C6 to C50.

As used herein, when a definition is not otherwise provided, "substituted" refers to replacement of a, e.g., at least one, hydrogen of a compound or the corresponding moiety by a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group ($—NO_2$), a cyano group (—CN), an amino group ($—NR^1R^2$ wherein $R^1$ and $R^2$ are each independently hydrogen or a C1 to C6 alkyl group), an azido group ($—N_3$), an amidino group ($—C(=NH)NH_2$), a hydrazino group ($—NHNH_2$), a hydrazono group ($=N(NH_2)$), an aldehyde group (—C(=O)H), a carbamoyl group ($—C(O)NH_2$), a thiol group (—SH), an ester group ($—C(=O)OR^3$, wherein $R^3$ is a C1 to C6 alkyl group or a C6 to C12 aryl group), a carboxyl group (—COOH) or a salt thereof (—C(=O)OM, wherein M is an organic or inorganic cation), a sulfonic acid group ($—SO_3H$) or a salt thereof ($—SO_3M$, wherein M is an organic or inorganic cation), a phosphoric acid group ($—PO_3H_2$) or a salt thereof ($—PO_3MH$ or $—PO_3M_2$, wherein M is an organic or inorganic cation), or a combination thereof. The indicated number of carbon atoms in a group may be exclusive of any substituents, e.g., a cyanoethyl group is a C2 hydrocarbon group substituted with a cyano group.

As used herein, the expression "not including cadmium (or other harmful heavy metal)" may refer to the case in which a concentration of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other toxic heavy toxic metal) may be present or, if present, an amount of cadmium (or other heavy metal) may be less than or equal to a detection limit or as an impurity level of a given analysis tool (e.g., an inductively coupled plasma atomic emission spectroscopy instrument).

As used herein, when a definition is not otherwise provided, "hydrocarbon" or "hydrocarbon group" refers to a compound or a group including carbon and hydrogen (e.g., alkyl, alkenyl, alkynyl, or aryl group). The hydrocarbon group may be a monovalent group or a group having a valence of greater than one formed by removal of a, e.g., one or more, hydrogen atoms from alkane, alkene, alkyne, or arene. In the hydrocarbon or hydrocarbon group, a, e.g., at least one, methylene may be replaced by an oxide moiety, a carbonyl moiety, an ester moiety, —NH—, or a combination thereof. Unless otherwise stated to the contrary, the hydrocarbon compound or hydrocarbon group (alkyl, alkenyl, alkynyl, or aryl) may have 1 to 60, 2 to 32, 3 to 24, or 4 to 12 carbon atoms.

As used herein, when a definition is not otherwise provided, "alkyl" refers to a linear or branched saturated monovalent hydrocarbon group (methyl, ethyl hexyl, etc.). In an embodiment, an alkyl group may have from 1 to 50 carbon atoms, or 1 to 18 carbon atoms, or 1 to 12 carbon atoms.

As used herein, when a definition is not otherwise provided, "alkenyl" refers to a linear or branched monovalent hydrocarbon group having a carbon-carbon double bond. In an embodiment, an alkenyl group may have from 2 to 50 carbon atoms, or 2 to 18 carbon atoms, or 2 to 12 carbon atoms.

As used herein, when a definition is not otherwise provided, "alkynyl" refers to a linear or branched monovalent hydrocarbon group having a carbon-carbon triple bond. In an embodiment, an alkenyl group may have from 2 to 50 carbon atoms, or 2 to 18 carbon atoms, or 2 to 12 carbon atoms.

As used herein, when a definition is not otherwise provided, "aryl" refers to a group formed by removal of a, e.g., at least one, hydrogen from an arene (e.g., a phenyl or naphthyl group). In an embodiment, an aryl group may have from 6 to 50 carbon atoms, or 6 to 18 carbon atoms, or 6 to 12 carbon atoms.

As used herein, when a definition is not otherwise provided, "hetero" refers to inclusion of 1 to 3 heteroatoms, e.g., N, O, S, Si, P, or a combination thereof.

As used herein, when a definition is not otherwise provided, "alkoxy" refers to an alkyl group linked to oxygen (e.g., alkyl-O—) for example, a methoxy group, an ethoxy group, or a sec-butyloxy group.

As used herein, when a definition is not otherwise provided, "amine" or "amine group" is a group represented by —NRR, wherein each R is independently hydrogen, a C1-C12 alkyl group, a C7-C20 alkylarylene group, a C7-C20 arylalkylene group, or a C6-C18 aryl group.

In an embodiment, "aliphatic group" or "aliphatic hydrocarbon" may refer to a saturated or unsaturated linear or branched C1 to C30 group including carbon and hydrogen. In the "aliphatic group" or "aliphatic hydrocarbon," a, e.g., at least one, methylene may be replaced by an oxide moiety, a carbonyl moiety, an ester moiety, —NH—, or a combination thereof. the "aliphatic group" or "aliphatic hydrocarbon" may consist of carbon and hydrogen.

As used herein, when a definition is not otherwise provided, "aromatic" or "aromatic organic group" may include a C6 to C30 aryl group or a C2 to C30 heteroaryl group, and "alicyclic group" refers to a saturated or unsaturated C3 to C30 cyclic group including carbon and hydrogen.

As used herein, when a definition is not otherwise provided, "alkylene group" refers to a straight or branched saturated aliphatic hydrocarbon group having at least two valences and optionally substituted with a, e.g., at least one, substituent. The alkylene group may have from 1 to 12, or 1 to 8, or 1 to 6 carbon atoms.

As used herein, when a definition is not otherwise provided, "arylene group" refers to a functional group having at least two valences obtained by removal of at least two hydrogens in an, e.g., at least one, aromatic ring, and optionally substituted with a, e.g., at least one, substituent.

As used herein, a carboxyl group (e.g., represented by "COO") may be a carboxylic acid group (COOH), a carboxyl anion ($COO^-$) group, or both. In an embodiment, such groups may be present in a complexed or salt form, which are included in the definition of carboxy.

As used herein, when a definition is not otherwise provided, "chalcogen" is inclusive of sulfur (S), selenium (Se), and tellurium (Te). In an embodiment, "chalcogen" may include or may not include oxygen (O).

Unless defined to the contrary, a numerical range recited herein is inclusive. Unless defined to the contrary, a numerical range recited herein includes any real number within the endpoints of the stated range and includes the endpoints thereof. As used herein, the upper and lower endpoints set forth for various values may be independently combined to provide a range.

As used herein, a nanostructure or a nanoparticle is a structure having a, e.g., at least one, region or characteristic dimension with a dimension of less than or equal to about 500 nm. In an embodiment, a dimension (or an average) of the nanostructure is less than or equal to about 300 nm, less than or equal to about 250 nm, less than or equal to about 150 nm, less than or equal to about 100 nm, less than or equal to about 50 nm, or less than or equal to about 30 nm. In an embodiment, the structure may have any suitable shape. The nanostructure may include a nanowire, a nanorod, a nanotube, a branched nanostructure, a nanotetrapod, a nanotripod, a nanobipod, a nanocrystal, a nanodot, a multi-pod type shape such as at least two pods, or the like and is not limited thereto. The nanostructure or the nanoparticle may be, e.g., substantially crystalline, substantially monocrystalline, polycrystalline, (for example, at least partially) amorphous, or a combination thereof.

In an embodiment, a semiconductor nanoparticle or a semiconductor nanostructure may exhibit quantum confinement or exciton confinement. As used herein, the term "semiconductor nanoparticle" or "semiconductor nanostructure" is not limited in a shape thereof unless otherwise defined. A semiconductor nanoparticle or a semiconductor nanostructure may have a size smaller than a Bohr excitation diameter for a bulk crystal material having an identical composition and may exhibit a quantum confinement effect. The semiconductor nanoparticle or the semiconductor nanostructure may emit light corresponding to a bandgap energy thereof by controlling a size of a nanocrystal acting as an emission center.

As used herein, the term "T50" is a time (hours (hr)) the brightness (e.g., luminance) of a given device decreases to 50% of the initial brightness (100%) as, e.g., when, the given device is driven, e.g., operated, at a predetermined brightness.

As used herein, the term "a voltage difference at T50" refers to a difference between an initial voltage and a voltage at T50 as, e.g., when, the given device is driven, e.g., operated, at a predetermined brightness.

Hereinafter, values of a work function, a conduction band, or a lowest unoccupied molecular orbital (LUMO) (or valence band or highest occupied molecular orbital (HOMO)) energy level is expressed as an absolute value from a vacuum level. In addition, when the work function or the energy level is referred to be "deep," "high" or "large," the work function or the energy level has a large absolute value based on "0 electronvolts (eV)" of the vacuum level, while when the work function or the energy level is referred to be "shallow," "low," or "small," the work function or energy level has a small absolute value based on "0 eV" of the vacuum level.

As used herein, a normalized intensity of a peak assigned to a predetermined functional group is an absorbance value at a given wavenumber in a curve that is obtained by normalizing a FTIR spectrum plotting a wavenumber versus an absorbance with respect to a base line including the peak. The normalization may be made reproducibly by a commercially available data-processing computer program such as Excel® of Microsoft Co. Ltd.

As used herein, the phrase "external quantum efficiency (EQE)" is a ratio of the number of photons emitted from a light emitting diode (LED) to the number of electrons passing through the device, and may be a measurement as to how efficiently a given device converts electrons to photons and allows the photons to escape. The EQE may be determined by the following equation:

EQE=an efficiency of injection×a (solid-state) quantum yield×an efficiency of extraction.

Wherein the efficiency of injection is a proportion of electrons passing through the device that are injected into the active region, the quantum yield is a proportion of all electron-hole recombination in the active region that are radiative and produce photons, the efficiency of extraction is a proportion of photons generated in the active region that escape from the given device.

As used herein, a maximum EQE is a greatest value of the EQE.

As used herein, a maximum luminance is a greatest value of the luminance a given device may achieve.

A bandgap energy of a semiconductor nanoparticle may vary with a size, structure, and a composition of a nanocrystal. A semiconductor nanocrystal may be used as a light emitting material in various fields of, e.g., such as in, a display device, an energy device, or a bio light emitting device.

A semiconductor nanoparticle electroluminescent device (hereinafter, also referred to as a QD-LED) may emit light by applying a voltage and includes a semiconductor nanoparticle as a light emitting material. A QD-LED may realize, e.g., display or exhibit, more pure, e.g., higher purity, colors (e.g., red, green, and blue) and improved color reproducibility, may be a next generation display device. Semiconductor nanoparticles exhibiting a desirable electroluminescent property may contain a harmful heavy metal such as cadmium (Cd), lead, mercury, or a combination thereof. Accordingly, it is desirable to provide an electroluminescent device or a display device having a light emitting layer including semiconductor nanoparticles substantially free of cadmium.

In an embodiment, an electroluminescent device may be a luminescent type of electroluminescent device configured to emit a desired light by applying a voltage, for example without using a separate light source, and a display device including the same. In an embodiment, the luminescent device and the display device are environmentally friendly.

In an embodiment, an electroluminescent device includes a first electrode 1 and a second electrode 5 spaced apart each other (e.g., each having a surface opposite the other, i.e., each with a surface facing each other); and a light emitting layer 3 disposed between the first electrode 1 and the second electrode 5. In an embodiment, the light emitting layer 3 may not include cadmium. An electron auxiliary layer (e.g., an electron transport layer) 4 may be disposed between the light emitting layer 3 and the second electrode 5. In an embodiment, the electroluminescent device may further include a hole auxiliary layer 2 between the light emitting layer and the first electrode. The hole auxiliary layer may include a hole transport layer including an organic compound, a hole injection layer, or a combination thereof. See FIG. 1. The first electrode may include an anode, and the second electrode may include a cathode. The first electrode may include a cathode and the second electrode may include an anode.

Figure 2:
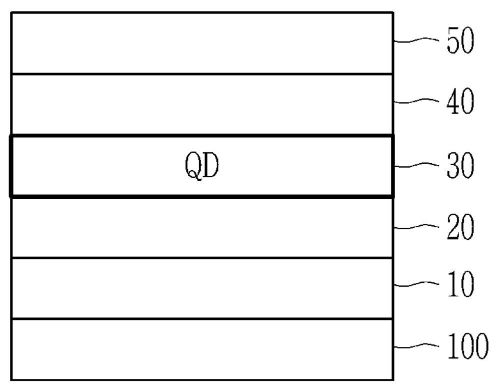
FIG. 2 is a schematic cross-sectional view of a light-emitting device according to an embodiment.
Figure 3:
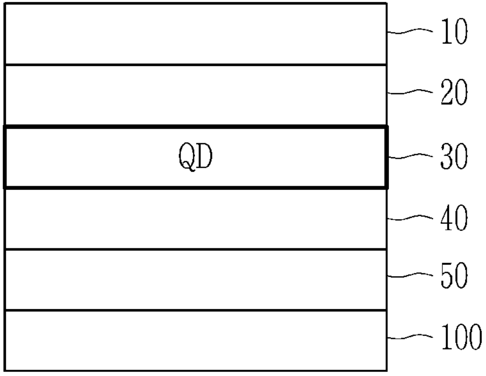
FIG. 3 is a schematic cross-sectional view of a light-emitting device according to an embodiment.

In the electroluminescent device of an embodiment, the first electrode 10 or the second electrode 20 may be disposed on a (transparent) substrate. The transparent substrate may be a light extraction surface as depicted in FIG. 2 and FIG. 3. The light emitting layer may be disposed in a pixel of a display device described herein.

Referring to FIGS. 2 and 3, in an electroluminescent device of an embodiment, a light emitting layer 30 may be disposed between a first electrode (e.g., anode) 10 and a second electrode (e.g., cathode) 50. The cathode 50 may include an electron injection conductor. The anode 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

The electron/hole injection conductors may include a metal-based material (e.g., a metal, a metal compound, an alloy, or a combination thereof) (e.g., aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

The first electrode, the second electrode, or a combination thereof may be a light-transmitting electrode or a transparent electrode. In an embodiment, both the first electrode and the second electrode may be a light-transmitting electrode. The first electrode, the second electrode, or a combination thereof may be patterned electrodes. The first electrode, the second electrode, or a combination thereof may be disposed on a (e.g., insulating) substrate 100. The substrate 100 may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and, for example, less than or equal to about 99%, or less than or equal to about 95%). The substrate 100 may include a region for a blue pixel, a region for a red pixel, a region for a green pixel, or a combination thereof. A thin film transistor may be disposed in each region of the substrate, and a source electrode or a drain electrode of the thin film transistor may be electrically connected to the first electrode or the second electrode.

The light-transmitting electrode may be disposed on a (e.g., insulating) transparent substrate. The substrate 100 may be a rigid or a flexible substrate. The substrate 100 may include a plastic or organic material such as a polymer, an inorganic material such as a glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg:Ag, or the like, or a thin metal thin film of a single layer or a plurality of layers, but is not limited thereto. If one of the first electrode or the second electrode is an opaque electrode, the opaque electrode may be made of an opaque conductor such as aluminum (Al), a lithium-aluminum (Li:Al) alloy, a magnesium-silver (Mg:Ag) alloy, and lithium fluoride-aluminum (LiF:Al).

The thickness of each electrode (the first electrode, the second electrode, or a combination thereof) is not particularly limited and may be appropriately selected taking into consideration device efficiency. For example, the thickness of the electrode may be greater than or equal to about 5 nm, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers (μm), less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

The light emitting layer 30 disposed between the first electrode and the second electrode (e.g., the anode 10 and the cathode 50) may include a plurality of semiconductor nanoparticles (e.g., blue light emitting nanoparticles, red light emitting nanoparticles, green light emitting nanoparticles, or a combination thereof). In an embodiment, the semiconductor nanoparticles may not comprise cadmium. The light emitting layer may include one or more (e.g., 2 or more or 3 or more and 10 or less) monolayers of a plurality of nanoparticles.

The light emitting layer may be patterned. In an embodiment, the patterned light emitting layer may include a blue light emitting layer disposed in the blue pixel. In an embodiment, the light emitting layer may further include a red light emitting layer disposed in the red pixel or a green light emitting layer disposed in the green pixel. In an embodiment, the light emitting layer may include a red light emitting layer disposed in the red pixel and a green light emitting layer disposed in the green pixel. Each of the (e.g., red, green, or blue) light emitting layers may be (e.g., optically) separated from an adjacent light emitting layer by a partition wall. In an embodiment, partition walls such as black matrices may be disposed between the red light emitting layer, the green light emitting layer, and the blue light emitting layer. The red light emitting layer, the green light emitting layer, and the blue light emitting layer may be optically isolated from each other.

In an embodiment, the light emitting layer or the semiconductor nanoparticle may not include cadmium. In an embodiment, the light emitting layer or the semiconductor nanoparticle may not include mercury, lead, or a combination thereof.

In an embodiment, the semiconductor nanoparticle may have a core-shell structure. In an embodiment, the semiconductor nanoparticle or the core-shell structure may include a core including a first semiconductor nanocrystal and a shell including a second semiconductor nanocrystal disposed on the core and having a composition different from that of the first semiconductor nanocrystal.

The semiconductor nanoparticle (or the first semiconductor nanocrystal, the second semiconductor nanocrystal, or a combination thereof) may include a Group II-VI compound, a Group III-V compound, a Group IV-VI compound, a Group IV element or compound, a Group I-III-VI compound, a Group II-III-VI compound, a Group I-II-IV-VI compound, or a combination thereof. In an embodiment, the light emitting layer or the semiconductor nanoparticle (e.g., the first semiconductor nanocrystal or the second semiconductor nanocrystal) may not include cadmium. In an embodiment, the light emitting layer or the semiconductor nanoparticle (e.g., the first semiconductor nanocrystal or the second semiconductor nanocrystal) may not include lead. In an embodiment, the light emitting layer or the semiconductor nanoparticle (e.g., the first semiconductor nanocrystal or the second semiconductor nanocrystal) may not include a combination of lead and cadmium.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; a quaternary element compound such as HgZnTeS, HgZnSeS, HgZnSeTe, HgZnSTe, or a combination thereof; or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (e.g., InZnP).

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof.

Examples of the Group I-III-VI compound may be $CuInSe_2$, $CuInS_2$, CuInGaSe, and CuInGaS, but are not limited thereto.

Examples of the Group I-II-IV-VI compound may be CuZnSnSe, and CuZnSnS, but are not limited thereto.

The Group IV element or compound may include a single-element compound such as Si, Ge, or a combination thereof; a binary element compound such as SiC, SiGe, or a combination thereof; or a combination thereof.

In an embodiment, the semiconductor nanoparticle may include a metal including indium, gallium, zinc, or a combination thereof, and a non-metal including a Group V element such as phosphorus, arsenic, or a combination thereof, a Group VI element such as selenium, tellurium, sulfur, or a combination thereof. In an embodiment, the semiconductor nanoparticle may include a zinc chalcogenide. The zinc chalcogenide may include zinc; and a chalcogen element (e.g., sulfur, selenium, tellurium, or a combination thereof). The semiconductor nanoparticle may include an indium phosphide, a gallium phosphide, an indium gallium phosphide, an indium arsenide, a gallium arsenide, an indium gallium arsenide, or a combination thereof.

In an embodiment, the semiconductor nanoparticle may have the core-shell structure. In an embodiment, the first semiconductor nanocrystal may include a metal including indium, zinc, or a combination thereof and a non-metal including phosphorus, selenium, tellurium, sulfur, or a combination thereof. In an embodiment, the second semiconductor nanocrystal may include a metal including indium, zinc, or a combination thereof, and a non-metal including phosphorus, selenium, tellurium, sulfur, or a combination thereof.

In an embodiment, a first semiconductor nanocrystal may include InP, InZnP, ZnSe, ZnSeS, ZnSeTe, or a combination thereof. The second semiconductor nanocrystal may include ZnSe, ZnSeS, ZnS, ZnTeSe, or a combination thereof. In an embodiment, the shell may include a zinc chalcogenide. The zinc chalcogenide may include zinc; and a chalcogen element (e.g., selenium, sulfur, tellurium, or a combination thereof).

In an embodiment, the semiconductor nanoparticle may include a core (a first semiconductor nanocrystal) including ZnSeTe, ZnSe, or a combination thereof and a shell (a second semiconductor nanocrystal) including a zinc chalcogenide (e.g., ZnS, ZnSe, ZnTeSe, ZnSeS or a combination thereof).

In an embodiment, the semiconductor nanoparticle may emit blue light or green light and may include a Group III-V compound including indium, phosphorus, and may optionally further include zinc, a zinc chalcogenide (e.g., ZnSeTe), or a combination thereof. In an embodiment, the nanoparticle (configured to emit green light) may include a semiconductor nanocrystal core and a semiconductor nanocrystal shell disposed on the core and including a Group II-V compound. The semiconductor nanocrystal core may include an indium phosphide, an indium zinc phosphide, or a combination thereof. In an embodiment, the semiconductor nanocrystal core may include a zinc selenium telluride (ZnTeSe).

In an embodiment, the red light emitting nanoparticle may include a (semiconductor nanocrystal) core including indium (In), phosphorus (P), and may optionally further include zinc (Zn), and a (semiconductor nanocrystal) shell disposed on the surface of the core and including zinc, sulfur, and may optionally further include selenium.

The semiconductor nanocrystal shell or the zinc chalcogenide may include zinc and a chalcogen element (e.g., sulfur, selenium, or a combination thereof). An amount of sulfur in the shell may increase or decrease in a radial direction (from the core toward the surface), e.g., the amount of sulfur may have a concentration gradient wherein the concentration of sulfur varies radially (e.g., decreases or increases toward the core).

In an embodiment, the semiconductor nanocrystal shell may have a composition that varies in a radial direction. In an embodiment, the shell may be a multilayered shell including two or more layers. In a multilayered shell, adjacent two layers may have different compositions from each other. In a multilayered shell, a, e.g., at least one, layer may independently include a semiconductor nanocrystal having a single composition. In a multilayered shell, a, e.g., at least one, layer may independently have an alloyed semiconductor nanocrystal. In a multilayered shell, a, e.g., at least one, layer may have a concentration gradient that varies radially in terms of a composition of a semiconductor nanocrystal.

In an embodiment, the multi-layered shell may include a first shell layer disposed (directly) on the core and an outer layer (e.g., an outermost layer) disposed (directly) on the first shell layer, and the first shell layer may include ZnSe, ZnSeS, or a combination thereof. The outer shell or the outermost shell layer may include ZnS. The shell may include a gradient alloy having a concentration gradient wherein an amount of the sulfur may increase (or decrease) away from the core.

In an embodiment, in a semiconductor nanoparticle having a core-shell structure, a shell material may have a bandgap energy that is larger, e.g., greater, than that of the core. The materials of the shell may have a bandgap energy that is smaller, e.g., less, than that of the core. In the case of a multilayered shell, the bandgap energy of the outermost layer material of the shell may be greater than the bandgap energies of the core and the inner layer material of the shell (layers that are closer to the core). In the case of a multi-layered shell, a semiconductor nanocrystal of each layer is selected to have an appropriate bandgap, thereby effectively showing, e.g., exhibiting, a quantum confinement effect.

A size (or an average size) of the core may be greater than or equal to about 0.5 nm, greater than or equal to about 1 nm, greater than or equal to about 2 nm, greater than or equal to about 3 nm, greater than or equal to about 4 nm, or greater than or equal to about 5 nm. A size (or an average size) of the core may be less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, or less than or equal to about 2 nm. A thickness of the semiconductor nanocrystal shell may be greater than or equal to about 0.1 nm, greater than or equal to about 0.3 nm, greater than or equal to about 0.5 nm, greater than or equal to about 1 nm, greater than or equal to about 1.5 nm, greater than or equal to about 2 nm, or greater than or equal to about 2.5 nm and less than or equal to about 5 nm, less than or equal to about 4 nm, less than or equal to about 3 nm, less than or equal to about 2 nm, or less than or equal to about 1.5 nm.

The shape of the quantum dot or the semiconductor nanoparticle is not particularly limited. For example, the shape of the quantum dot may include, but is not limited to, a sphere, a polyhedron, a pyramid, a multi-pod shape, a hexahedron, a cube, a cuboid, a nanotube, a nanorod, a nanowire, a nanosheet, or a combination thereof.

A maximum luminescent peak wavelength of the semiconductor nanoparticle may have a wavelength region of ultraviolet to infrared wavelengths or more, e.g., greater. In an embodiment, the maximum luminescent peak wavelength of the semiconductor nanoparticle may be greater than or equal to about 300 nm, greater than or equal to about 440 nm, greater than or equal to about 445 nm, greater than or equal to about 450 nm, greater than or equal to about 455 nm, greater than or equal to about 460 nm, greater than or equal to about 465 nm, greater than or equal to about 470 nm, greater than or equal to about 475 nm, greater than or equal to about 480 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum luminescent peak wavelength of the semiconductor nanoparticle may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum luminescent peak wavelength of the semiconductor nanoparticle may be in the range of about 500 nm to about 650 nm.

The semiconductor nanoparticle may emit green light (for example, on an application of a voltage or irradiation with light) and the maximum luminescent peak wavelength may be in the range of greater than or equal to about 500 nm (for example, greater than or equal to about 510 nm, greater than or equal to about 515 nm) and less than or equal to about 560 nm, for example, less than or equal to about 540 nm, or less than or equal to about 530 nm.

The semiconductor nanoparticle may emit red light, (for example, on an application of voltage or irradiation with light), and the maximum luminescent peak wavelength may be in the range of greater than or equal to about 600 nm, for example, greater than or equal to about 610 nm and less than or equal to about 650 nm, or less than or equal to about 640 nm.

The semiconductor nanoparticle may emit blue light, (for example, on an application of voltage or irradiation with light) and the maximum luminescent peak wavelength may be greater than or equal to about 430 nm (for example, greater than or equal to about 435 nm, greater than or equal to about 440 nm, greater than or equal to about 446 nm, greater than or equal to about 449 nm, greater than or equal to about 450 nm) and less than or equal to about 480 nm (for example, less than or equal to about 470 nm, less than or equal to about 465 nm, less than or equal to about 460 nm, or less than or equal to about 455 nm).

In an embodiment, the semiconductor nanoparticle may exhibit a luminescent spectrum (e.g., photo- or electro-luminescent spectrum) with a relatively narrow full width at half maximum. In an embodiment, in the photo- or electro-luminescent spectrum, the semiconductor nanoparticle may exhibit a full width at half maximum of less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm. The full width at half maximum may be greater than or equal to about 5 nm, greater than or equal to about 10 nm, greater than or equal to about 15 nm.

In a luminescent spectrum thereof, the semiconductor nanoparticle may exhibit a full width at half maximum of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. The full width at half maximum may be greater than or equal to about 12 nm, greater than or equal to about 20 nm, greater than or equal to about 25 nm, or greater than or equal to about 26 nm.

The semiconductor nanoparticle may exhibit (or be configured to realize, e.g., exhibit) a quantum yield (or quantum efficiency) of greater than or equal to about 10%, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or greater than or equal to about 100%. In an embodiment, the nanoparticle may exhibit (or be configured to realize, e.g., exhibit) a quantum yield (or quantum efficiency) of greater than or equal to about 60%, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, greater than or equal to about 69%, greater than or equal to about 70%, or greater than or equal to about 71%. The semiconductor nanoparticle may exhibit (or be configured to realize, e.g., exhibit) a quantum yield (or quantum efficiency) of greater than or equal to about 80%, greater than or equal to about 90%, greater than or equal to about 95%, greater than or equal to about 99%, or greater than or equal to about 100%.

The semiconductor nanoparticle may have a size (or an average size, hereinafter, may be simply referred to as "size") of greater than or equal to about 1 nm and less than or equal to about 100 nm. In an embodiment, the semiconductor nanoparticle may have a size of from about 1 nm to about 50 nm, for example, from about 2 nm (or about 3 nm) to about 35 nm. In an embodiment, a size (or an average size) of the semiconductor nanoparticle may be greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. In an embodiment, a size (or an average size) of the semiconductor nanoparticle may be less than or equal to about 50 nm, less than or equal to about 40 nm, less than or equal to about 35 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm. As used herein, the average may be a mean average or a median average.

As used herein, the size of the semiconductor nanoparticle may refer to a diameter or an equivalent diameter obtained from a two-dimensional image of an electron microscopy analysis (e.g., under an assumption of a circle). As used herein, the size of the semiconductor nanoparticle may be obtained from an inductively coupled plasma atomic emission spectroscopy analysis.

The semiconductor nanoparticle may be prepared for example by a chemical wet method. In an embodiment, the semiconductor nanoparticle may be prepared by a reaction between precursors in a reaction system including an organic solvent and an organic ligand. In an embodiment, for example, the method of preparing the semiconductor nanoparticle having a core/shell structure may include obtaining the core; reacting shell precursors (e.g., a shell metal precursor and a shell non-metal precursor) in the presence of the core in a reaction system including an organic ligand (e.g., a native organic ligand) and an organic solvent.

In an example embodiment, in order to form the shell, a solvent and optionally a ligand compound, are heated at a predetermined temperature (e.g., greater than or equal to about 100° C.) under vacuum (or vacuum-treated) and then, after introducing an inert gas into the reaction vessel, the reaction mixture is again heat-treated at a predetermined temperature (e.g., greater than or equal to 100° C.).

A reaction temperature and a reaction time may be selected appropriately. The reaction temperature may be greater than or equal to about 180° C., greater than or equal to about 200° C., greater than or equal to about 240° C., or greater than or equal to about 280° C. and less than or equal to about 360° C., less than or equal to about 340° C., or less than or equal to about 320° C. The reaction time may be greater than or equal to about 1 minute, greater than or equal to about 30 minutes and less than or equal to about 10 hours, less than or equal to about 2 hours, or less than or equal to about 1 hour.

In an embodiment, the precursor, the organic solvent, and the (native) organic ligand may be selected appropriately and not particularly limited. In an embodiment, the organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one (e.g., 1, 2, or 3), C6 to C22 alkyl group, a phosphine oxide (e.g., trioctylphosphine oxide) substituted with a (e.g., 1, 2, or 3) C6 to C22 alkyl group, a C12 to C22 aromatic ether such as phenyl ether or benzyl ether, or a combination thereof.

The organic ligand may coordinate or interact with the surfaces of the prepared nanostructures and allow the nanostructures to be well dispersed in the solution. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR", $RPO(OH)_2$, $R_2POOH$, wherein, R and R" each independently include C1 or more, C6 or more, or C10 or more and C40 or less, C35 or less, or C25 or less substituted or unsubstituted aliphatic hydrocarbon, or substituted or unsubstituted C6 to C40 aromatic hydrocarbon, or a combination thereof), or a combination thereof. The organic ligand may be used alone or as a mixture of two or more compounds.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine compound such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octyl phosphine, dioctyl phosphine, tributyl phosphine, trioctyl phosphine, and the like; a phosphine oxide compound such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, trioctyl phosphine oxide, and the like; a diphenyl phosphine compound, a triphenyl phosphine compound, or an oxide compound thereof; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid, and the like; a C5 to C20 alkyl phosphonic acid; and the like, but are not limited thereto.

In an embodiment for example adopting a wet chemical method, after completing the reaction (for the formation of the core or for the formation of the shell), a nonsolvent is added to reaction products and nanoparticle coordinated with the ligand compound may be separated. The nonsolvent may be a polar solvent that is miscible with the solvent used in the core formation reaction, shell formation reaction, or a combination thereof and is not capable of dispersing the prepared nanocrystals. The nonsolvent may be selected depending on the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The semiconductor nanocrystal particles may be separated through centrifugation, sedimentation, or chromatography. The separated nanocrystals may be washed with a washing solvent, if needed. The washing solvent has no particular limit and may have a similar solubility parameter to that of the ligand and may, for example, include hexane, heptane, octane, chloroform, toluene, benzene, and the like.

The semiconductor nanoparticles of an embodiment may be non-dispersible or water-insoluble in water, the aforementioned nonsolvent, or a combination thereof. The semiconductor nanoparticles of an embodiment may be dispersed in the aforementioned organic solvent. In an embodiment, the aforementioned semiconductor nanoparticles may be dispersed in a C6 to C40 aliphatic hydrocarbon, a substituted or unsubstituted C6 to C40 aromatic hydrocarbon, or a combination thereof.

The prepared semiconductor nanoparticles may be surface-treated with a halogen compound. By the surface-treatment with the halogen compound, at least a portion of the organic ligand may be replaced with the halogen. The halogen treated semiconductor nanoparticles may include a reduced amount of the organic ligand. The halogen treatment may be carried out contacting the semiconductor nanoparticles with the halogen compound (e.g., a metal halide such as a zinc chloride) at a predetermined temperature of from about 30° C. to about 100° C. or from about 50° C. to about 150° C. in an organic solvent. The halogen treated semiconductor nanoparticle may be separated by using the aforementioned non-solvent.

In an electroluminescent device of an embodiment or a display device including the same, the semiconductor nanoparticle may include an organic ligand for example on a surface thereof. The organic ligand may interact with (e.g., be bonded to or coordinate to) the semiconductor nanoparticle, e.g., the surface of the semiconductor nanoparticle. The organic ligand may be desired for imparting a necessary dispersibility to the nanoparticle during the production process of the device.

Without wishing to be bound by any theory, it is believed that the organic ligand may be (present as being) bonded with a surface atom of the nanoparticle, and may contribute to the suppression of non-radiative transition resulting from the surface defects of the given nanoparticle. However, the present inventors have found that the organic ligand may have a substantial effect on the electrons and holes moving toward the light emitting layer. Without wishing to be bound by any theory, it is believed that the organic ligands may form a dipole on the surface of the nanoparticle, changing the energy level of the light emitting layer.

The organic ligand (e.g., a native ligand) provided from the chemical wet synthesis method, however, may have a relatively long organic chain for the dispersibility, and without wishing to be bound by any theory, it is believed that such an organic ligand may cause a substantial increase in the interparticle spacing between the nanoparticles, and the increased interparticle spacing may have an adverse effect on the charge movement in the electroluminescent device. In this regard, the present inventors have also found that the conventional (native) ligand used in the art may increase the insulating property of the semiconductor nanoparticle and the increased amount of the conventional (native) ligand may substantially interrupt the hole injection from the hole auxiliary layer (e.g., the hole transporting layer) to the light emitting layer, which may reduce the charge movement in the light emitting layer to an unwanted level.

In the light emitting device of an embodiment, a charge mobility property and an electric conducting property in the light emitting layer including the semiconductor nanoparticle described herein may be improved and controlled, whereby a luminescent property of the semiconductor nanoparticle may be maintained at a desired level. The electroluminescent device of an embodiment may include the light emitting layer described herein to exhibit enhanced electroluminescent properties together with the extended lifespan.

In an electroluminescent device of an embodiment, the light emitting layer further includes a chemical species including a cyanide moiety (i.e., —CN); a cyanide anion (i.e., $CN^-$); or a combination thereof (hereinafter, referred to collectively as a "cyanide group"). The chemical species may further include a metal and may include an interaction (e.g., van der Waals force) or a bond between the metal and the cyanide moiety. The bond may be an ionic bond, a dative bond, or the like but is not limited thereto. As used herein, the cyanide moiety in the chemical species refers to a group including or consisting of a carbon atom and a nitrogen atom linked to the carbon atom via a triple bond, and may constitute an inorganic cyanide. In an embodiment, the cyanide moiety may be derived (or originated) from a cyanide compound (e.g., a soluble or water-soluble salt compound or an inorganic cyanide) having, for example, an ionic bond between a cation (e.g., a metal) and a cyanide anion. Details of the cyanide compound is described herein in more detail for example, referring to a method of the light emitting device of an embodiment.

The chemical species may include a bond between a metal (e.g., a metal present at a surface of the semiconductor nanoparticle or the shell thereof, for example, zinc) and a cyanide moiety. The cyanide moiety or the cyanide anion may be linked to a surface of the semiconductor nanoparticle (for example, via any type of bond, for example an ionic bond, a dative bond, or the like).

The chemical species may include or may not include a nitrile compound wherein the cyano group is linked to a carbon atom via a covalent bond. The nitrile compound may have a conjugated double bond. In an embodiment, the light emitting layer may not include a nitrile compound or a compound represented as NC—$R^4$—X2, wherein $R^4$ is a hydrocarbon group or a derivative of the hydrocarbon group, and X2 is NHCO—$CH_3$, $NH_2$, —CHO, or a carboxy group. In an embodiment, the light emitting layer may not include a nitrile compound for example a compound represented by NC—$R^5$, wherein $R^5$ is a hydrocarbon group including a conjugated group such as a benzene nitrile.

Without wishing to be bound by any theory, it is believed that the cyanide group included in the light emitting layer or the semiconductor nanoparticle may have a relatively strong electron withdrawing property, which may contribute to increasing an electron affinity. The present inventors have found that the co-presence of, e.g., the presence of both, the cyanide group and the semiconductor nanoparticle in the light emitting layer as described herein may have an effect on an energy level of the light emitting layer, enhancing an n-type property thereof.

In the luminescent device of an embodiment, the light emitting layer may exhibit a (e.g., at least one) peak that may be assigned to a cyanide group (hereinafter, a cyanide peak) in a FTIR spectroscopy analysis. The cyanide peak may be present in a range of a wavenumber of greater than or equal to about 1,900 $cm^{-1}$, greater than or equal to about 1,930 $cm^{-1}$, greater than or equal to about 1,950 $cm^{-1}$, greater than or equal to about 1,970 $cm^{-1}$, greater than or equal to about 1,990 $cm^{-1}$, greater than or equal to about 2,000 $cm^{-1}$, greater than or equal to about 2,030 $cm^{-1}$, greater than or equal to about 2,050 $cm^{-1}$, greater than or equal to about 2,070 $cm^{-1}$, greater than or equal to about, 2075 $cm^{-1}$, greater than or equal to about 2,080 $cm^{-1}$, greater than or equal to about 2,090 $cm^{-1}$, greater than or equal to about 2,100 $cm^{-1}$, greater than or equal to about 2,110 $cm^{-1}$, greater than or equal to about 2,130 $cm^{-1}$, greater than or equal to about 2,150 $cm^{-1}$, greater than or equal to about 2,160 $cm^{-1}$, greater than or equal to about 2,170 $cm^{-1}$, or greater than or equal to about 2,175 $cm^{-1}$. The cyanide peak may be present in a wavenumber range of less than or equal to about 2,300 $cm^{-1}$, less than or equal to about 2,290 $cm^{-1}$, less than or equal to about 2,270 $cm^{-1}$, less than or equal to about 2,250 $cm^{-1}$, less than or equal to about 2,230 $cm^{-1}$, less than or equal to about 2,210 $cm^{-1}$, less than or equal to about 2,200 $cm^{-1}$, less than or equal to about 2,190 $cm^{-1}$, less than or equal to about 2,185 $cm^{-1}$, less than or equal to about 2,180 $cm^{-1}$, less than or equal to about 2,170 $cm^{-1}$, less than or equal to about 2,150 $cm^{-1}$, less than or equal to about 2,130 $cm^{-1}$, less than or equal to about 2,110 $cm^{-1}$, less than or equal to about 2,100 $cm^{-1}$, less than or equal to about 2,090 $cm^{-1}$, or less than or equal to about 2,085 $cm^{-1}$.

The cyanide peak may include a first peak, a second peak having a higher wavenumber than the first peak, or both.

The first peak may be present in a wavenumber range of about 2,000 $cm^{-1}$ to about 2,150 $cm^{-1}$, about 2,020 $cm^{-1}$ to about 2,110 $cm^{-1}$, about 2,050 $cm^{-1}$ to about 2,100 $cm^{-1}$, about 2,060 $cm^{-1}$ to about 2,090 $cm^{-1}$, about 2,070 $cm^{-1}$ to about 2,085 $cm^{-1}$, or a combination thereof.

The second peak may be present in a wavenumber range of about 2,120 $cm^{-1}$ to about 2,300 $cm^{-1}$, about 2,140 $cm^{-1}$ to about 2,280 $cm^{-1}$, about 2,150 $cm^{-1}$ to about 2,230 $cm^{-1}$, about 2,160 $cm^{-1}$ to about 2,230 $cm^{-1}$, about 2,170 $cm^{-1}$ to about 2,210 $cm^{-1}$, about 2,175 $cm^{-1}$ to about 2,190 $cm^{-1}$, about 2,180 $cm^{-1}$ to about 2,185 $cm^{-1}$, or a combination thereof.

In the FTIR spectrum of the light emitting layer, a peak that may be assigned to a C—CN bond may not be exhibited, e.g., present, or may be present only with a limited intensity. In an embodiment, the peak assigned to the C—CN bond may be present in a wavenumber range of about 2,200 $cm^{-1}$ to about 2,250 $cm^{-1}$, or about 2,220 $cm^{-1}$ to about 2,235 $cm^{-1}$, or may be present at a wavenumber of about 2,230 $cm^{-1}$. In an embodiment, in the FTIR spectrum of the light emitting layer, an intensity ratio of the first peak or the second peak to the C—CN peak may be greater than or equal to about 2:1, greater than or equal to about 3:1, greater than or equal to about 4:1, or greater than or equal to about 5:1. In the FTIR spectrum of the light emitting layer, an intensity ratio of the first peak or the second peak to the C—CN peak may be 1,000:1, less than or equal to about 500:1, less than or equal to about 100:1, or less than or equal to about 50:1.

Without wishing to be bound by any theory, it is believed that the first peak may represent the presence of a cyanide anion in the light emitting layer. The cyanide anion may not be linked to a metal on a surface of the semiconductor nanoparticle. Without wishing to be bound by any theory, it is believed that the second peak may represent the presence of the cyanide moiety that is linked to a metal (e.g., zinc), for example, present on a surface of the semiconductor nanoparticle in the light emitting layer.

In the light emitting layer, a portion of a native ligand coordinating, e.g., bound to, the semiconductor nanoparticle from synthesis thereof may be exchanged with the cyanide group. In an embodiment, a portion of a chemical species having a COO moiety and bonding to a surface of the semiconductor nanoparticle (for example, an aliphatic acid organic ligand) may be replaced with the cyanide group. Therefore, the light emitting layer may include the semiconductor nanoparticle together with the organic ligand and the cyanide group.

The chemical species including the COO moiety or the organic ligand may further include a C5 to C40 aliphatic organic ligand (for example, a fatty acid). The aliphatic organic ligand may include a $C_{10-50}$ alkyl group, a $C_{10-50}$ alkenyl group, a $C_{10-50}$ alkynyl group, or a combination thereof.

The aliphatic organic ligand may include caprylic acid, capric acid, lauric acid, myristic acid, palmitic acid, stearic acid, arachidic acid, behemic acid, lignoceric acid, cerotic acid, myristoleic acid, palmitoleic acid, sapienic acid, oleic acid, elaidic acid, vaccenic acid, linoleic acid, linoelaidic acid, α-linolenic acid, arachidonic acid, eicosapentaenoic acid, erucic acid, docosahexaenoic, or a combination thereof.

In a luminescent device of an embodiment, the FTIR spectrum of the light emitting layer may have a peak assigned to the COO moiety in a wavenumber range of greater than or equal to about 1,400 $cm^{-1}$, greater than or equal to about 1,410 $cm^{-1}$, greater than or equal to about 1,420 $cm^{-1}$, greater than or equal to about 1,430 $cm^{-1}$, greater than or equal to about 1,440 $cm^{-1}$, greater than or equal to about 1,450 $cm^{-1}$, greater than or equal to about 1,460 $cm^{-1}$, greater than or equal to about 1,470 $cm^{-1}$, greater than or equal to about 1,480 $cm^{-1}$, greater than or equal to about 1,490 $cm^{-1}$, greater than or equal to about 1,500 $cm^{-1}$, greater than or equal to about 1,510 $cm^{-1}$, greater than or equal to about 1,520 $cm^{-1}$, or greater than or equal to 1,530 $cm^{-1}$ and less than or equal to about 1,650

$cm^{-1}$, less than or equal to about 1,630 $cm^{-1}$, less than or equal to about 1,610 $cm^{-1}$, less than or equal to about 1,600 $cm^{-1}$, less than or equal to about 1,590 $cm^{-1}$, less than or equal to about 1,580 $cm^{-1}$, less than or equal to about 1,570 $cm^{-1}$, less than or equal to about 1,560 $cm^{-1}$, less than or equal to about 1,550 $cm^{-1}$, less than or equal to about 1,540 $cm^{-1}$, less than or equal to about 1,530 $cm^{-1}$, less than or equal to about 1,520 $cm^{-1}$, less than or equal to about 1,510 $cm^{-1}$, less than or equal to about 1,500 $cm^{-1}$, less than or equal to about 1,490 $cm^{-1}$, or less than or equal to about 1,480 $cm^{-1}$.

The peak assigned to the COO moiety may include a first COO peak in a wavenumber range of from about 1,400 $cm^{-1}$ to about 1,500 $cm^{-1}$ and a second COO peak in a wavenumber range of from about 1,500 $cm^{-1}$ to about 1,600 $cm^{-1}$.

In the light emitting layer, a ratio of a maximum normalized intensity of the peak assigned to the cyanide group with respect to a normalized intensity of the COO peak (e.g., a first COO peak or a second COO peak) may be greater than or equal to about 0.01:1, greater than or equal to about 0.02:1, greater than or equal to about 0.03:1, greater than or equal to about 0.05:1, greater than or equal to about 0.07:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, or greater than or equal to about 0.15:1. In the light emitting layer, a ratio of a maximum normalized intensity of the peak assigned to the cyanide group with respect to a normalized intensity of the COO peak (e.g., a first COO peak or a second COO peak) may be less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, or less than or equal to about 0.2:1.

The semiconductor nanoparticle may include a zinc chalcogenide, and in the light emitting layer, a mole ratio of carbon to zinc may be greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, or greater than or equal to about 2.5:1. In the light emitting layer, a mole ratio of carbon to zinc may be less than or equal to about 4.3:1, less than or equal to about 4:1, less than or equal to about 3.8:1, less than or equal to about 3.5:1, less than or equal to about 3.3:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, or less than or equal to about 2.3:1.

In the light emitting layer, an amount of an element or a mole ratio between elements may be determined in an appropriate analyzing tool such as inductively coupled plasma atomic emission spectroscopy (ICP-AES) analysis, an X-ray photoelectron spectroscopy (XPS) analysis, a (transmission or scanning) electron microscopy energy dispersive X-ray (TEM or SEM-EDX) analysis, or the like, but is not limited thereto.

In an embodiment, the light emitting layer may further include chlorine, and in the light emitting layer, a mole ratio of chlorine to zinc may be greater than or equal to about 0.01:1, greater than or equal to about 0.02:1, greater than or equal to about 0.03:1, greater than or equal to about 0.05:1, greater than or equal to about 0.08:1 and less than or equal to about 1:1, less than or equal to about 0.8:1, less than or equal to about 0.6:1, less than or equal to about 0.5:1, less than or equal to about 0.3:1, less than or equal to about 0.15:1, or less than or equal to about 0.1:1.

Without wishing to be bound by any theory, it is believed that the light emitting layer of the luminescent device of an embodiment may exhibit a changed (e.g., deeper) HOMO and LUMO energy level than the light emitting layer of a native organic ligand, whereby exhibiting an improved electron injection property.

In an electroluminescent device of an embodiment, the light emitting layer may exhibit a reduced energy level difference with respect to an adjacent electron transporting layer described herein.

In an electroluminescent device of an embodiment, a difference of the LUMO level of the light emitting layer and the LUMO of the electron auxiliary layer may be greater than or equal to about 0.001 eV, greater than or equal to about 0.005 eV, greater than or equal to about 0.01 eV, greater than or equal to about 0.03 eV, greater than or equal to about 0.05 eV, greater than or equal to about 0.07 eV, greater than or equal to about 0.09 eV, greater than or equal to about 0.1 eV, greater than or equal to about 0.3 eV, or greater than or equal to about 0.5 eV. In an electroluminescent device of an embodiment, a difference of the LUMO level of the light emitting layer and the LUMO of the electron auxiliary layer may be less than or equal to about 1 eV, less than or equal to about 0.9 eV, less than or equal to about 0.8 eV, less than or equal to about 0.7 eV, or less than or equal to about 0.6 eV.

The energy level of the light emitting layer or the charge auxiliary layer (e.g., the electron auxiliary layer) may be measured by using a commercially available analysis tool (e.g., an AC-3 evaluation). In an embodiment, the HOMO energy level, the LUMO energy level, or a combination thereof recited herein may be a value measured by photoelectron spectroscopy in air (e.g., photoelectron spectrophotometer, model name AC-3 manufactured by Riken Keiki Co. Ltd.) or a value measured by using UPS (UV absorption (Optical band-gap)).

In a measurement involving the photoelectron spectroscopy analysis, when the photoelectron output is plotted on an X/Y axis, with horizontal axis as the UV energy applied, and the vertical axis as a standardized photoelectron yield ratio, the result is a curved line rising with a specific slope of degree and the HOMO level is a value at which the base line meets a straight and extending line obtained from the dots in a region of the increasing slope. The standardized photoelectron yield ratio, $(\text{Yield})^n$ is the ratio of photoelectron yield achieved per unit of UV energy applied to the sample surface, and "n" represents the strength of the UV energy applied and the "n" value is from about 0.3 to 1 (e.g., 0.33).

The HOMO level is obtained and an ultraviolet-visible (UV-Vis) absorption spectroscopy analysis may be used to calculate the bandgap energy, and from the HOMO and the bandgap energy, the LUMO may be calculated.

The present inventors have found that adopting the light emitting layer described herein to the electroluminescent device having the aforementioned structure may contribute to the improvement of the electroluminescent properties and the lifetime properties of the device. Without wishing to be bound by any theory, it is believed that the light emitting layer described herein may provide an improved electron and hole mobilities.

In an embodiment, as the light emitting layer is included in a hole only device (HOD) having a structure of an electrode (e.g., ITO)/HIL (e.g., poly(3,4-ethylenedioxythiophene) polystyrene sulfonate (PEDOT:PSS), e.g., 30 nm thickness)/HTL (e.g., poly(9,9-dioctyl-fluorene-co-N-(4)-butylphenyl)-diphenylamine) (TFB), e.g., 25 nm thickness)/EML (semiconductor nanoparticle, e.g., 28 nm thickness)/organic HTL (e.g., 36 nm thickness)/organic HIL (e.g., 10 nm thickness)/electrode (e.g., Ag), a hole transporting capability ($mA/cm^2$) at 8 volts as measured may be greater than or equal to about 3, greater than or equal to about 4, greater than or equal to about 5, greater than or equal to about 6, greater than or equal to about 7, greater than or equal to about 8, greater than or equal to about 9, greater than or equal to about 10, or greater than or equal to about 11. The hole transporting capability ($mA/cm^2$) at 8 volts may be less than or equal to about 30, less than or equal to about 20, less than or equal to about 18, less than or equal to about 15, less than or equal to about 14, less than or equal to about 13.5, less than or equal to about 13, less than or equal to about 12.5, less than or equal to about 12, less than or equal to about 11, less than or equal to about 10.5, less than or equal to about 10, or less than or equal to about 9.5. The measurement of the electron mobility or the hole mobility may be conducted in a sweep manner (e.g., at a third sweep).

In an embodiment, as the light emitting layer is included in an electron only device having a structure of Electrode (e.g., ITO)/ETL (e.g., zinc magnesium oxide, e.g., 30 nm thickness)/EML (semiconductor nanoparticle, e.g., 20 nm thickness)/ETL (e.g., zinc magnesium oxide, e.g., 30 nm thickness)/electrode (e.g., Ag), an electron transporting capability ($mA/cm^2$) as measured at 5 volts or 8 volts may be greater than or equal to about 2, greater than or equal to about 3, greater than or equal to about 5, greater than or equal to about 6, greater than or equal to about 7, greater than or equal to about 8, greater than or equal to about 9, greater than or equal to about 11, greater than or equal to about 13, greater than or equal to about 15, greater than or equal to about 17, greater than or equal to about 19, greater than or equal to about 20, greater than or equal to about 21, greater than or equal to about 23, greater than or equal to about 25, greater than or equal to about 27, greater than or equal to about 29, greater than or equal to about 30, greater than or equal to about 31, or greater than or equal to about 33. The electron transporting capability (ET, $mA/cm^2$) as measured at 5 volts or 8 volts may be less than or equal to about 60, less than or equal to about 50, less than or equal to about 45, less than or equal to about 40, less than or equal to about 36, less than or equal to about 30, less than or equal to about 25, less than or equal to about 20, less than or equal to about 19, less than or equal to about 18, less than or equal to about 17, less than or equal to about 16, less than or equal to about 15, less than or equal to about 14, less than or equal to about 13, less than or equal to about 12, or less than or equal to about 11.

In an embodiment, the light emitting layer may exhibit increased charge transporting abilities (HT, ET), and improved balance therebetween. In an embodiment, the light emitting layer may have the aforementioned range of the ET and a ratio of HT with respect to ET may be greater than or equal to about 0.7:1, greater than or equal to about 0.8:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, or greater than or equal to about 1.5:1. In an embodiment, the light emitting layer may exhibit a ratio of HT with respect to ET that is less than or equal to about 4:1, less than or equal to about 3.8:1, less than or equal to about 3.5:1, less than or equal to about 3:1, less than or equal to about 2.5:1, less than or equal to about 2:1, less than or equal to about 1.8:1, or less than or equal to about 1.5:1.

In the electroluminescent device, a thickness of the light emitting layer may be appropriately selected. In an embodiment, the light emitting layer may include a monolayer of nanoparticles. In an embodiment, the light emitting layer may include one or more, for example, two or more, three or more, or four or more and 20 or less, 10 or less, 9 or less, 8 or less, 7 or less, or 6 or less monolayers of nanoparticles. The light emitting layer may have a thickness of greater than or equal to about 5 nm, for example, greater than or equal to about 10 nm, greater than or equal to about 20 nm, or greater than or equal to about 30 nm and less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer may have a thickness of, for example, about 10 nm to about 150 nm, about 20 nm to about 100 nm, or about 30 nm to about 50 nm.

The electroluminescent device may further include a charge (hole or electron) auxiliary layer between the first electrode and the second electrode (e.g., an anode and a cathode). In an embodiment, the electroluminescent device may include a hole auxiliary layer 20 or an electron auxiliary layer 40 between the anode 10 and the light emitting layer 30, between the cathode 50 and the light emitting layer 30, or a combination thereof. See, FIGS. 2 and 3.

The hole auxiliary layer 20 may be disposed between the first electrode 10 and the light emitting layer 30. The hole auxiliary layer 20 may include a hole injection layer, a hole transport layer, an electron blocking layer, or a combination thereof. The hole auxiliary layer 20 may be a layer of a single component or a multilayer structure in which adjacent layers include different components.

The HOMO energy level of the hole auxiliary layer 20 may have a HOMO energy level that may be matched with the HOMO energy level of the light emitting layer 30 in order to enhance mobility of holes transferred from the hole auxiliary layer 20 to the light emitting layer 30. In an embodiment, the hole auxiliary layer 20 may include a hole injection layer close to the first electrode 10 and a hole transport layer close to the light emitting layer 30.

The material included in the hole auxiliary layer 20 (e.g., a hole transport layer, a hole injection layer, or an electron blocking layer) is not particularly limited, and may include for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4,4'-bis[N-(1-naphthyl)-N-phenyl-amino]biphenyl (α-NPD), m-MTDATA (4,4',4"-Tris[phenyl(m-tolyl)amino]triphenylamine), 4,4',4"-tis(N-carbazolyl)-triphenylamine (TCTA), 1,1-bis[(di-4-toylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

In the hole auxiliary layer, the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about for example, 40 nm, less than or equal to about 35 nm, or less than or equal to about 30 nm, but is not limited thereto.

The electron auxiliary layer 40 is disposed between the light emitting layer 30 and the second electrode 50. The electron auxiliary layer 40 may include, for example, an electron injection layer, an electron transport layer, a hole blocking layer, or a combination thereof. The electron auxiliary layer may include, for example, an electron injection layer (EIL) that facilitates injection of electrons, an electron transport layer (ETL) that facilitates transport of electrons, a hole blocking layer (HBL) that blocks the movement of holes, or a combination thereof.

In an embodiment, the electron injection layer may be disposed between the electron transport layer and the cathode. For example, the hole blocking layer may be disposed between the light emitting layer and the electron transport (injection) layer but is not limited thereto. The thickness of each layer may be selected appropriately. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles or may be an organic layer formed by vapor deposition.

The electron transport layer (ETL), the electron injection layer, the hole blocking layer, or a combination thereof may include for example, 1,4,5,8-naphthalene-tetracarboxylic dianhydride (NTCDA), bathocuproine (BCP), tris[3-(3-pyridyl)-mesityl]borane (3TPYMB), LiF $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.) or a combination thereof, but is not limited thereto.

The electron auxiliary layer 40 may include an electron transport layer. The electron transport layer may include a plurality of nanoparticles. The plurality of nanoparticles may include a metal oxide containing zinc.

The absolute value of the LUMO of the aforementioned nanoparticle included in the light emitting layer may be greater or smaller than the absolute value of the LUMO of the metal oxide. The average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

In an embodiment, each thickness of the electron auxiliary layer 40 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

The electron transport layer includes a plurality of metal oxide nanoparticles. An electron injection layer may be disposed between the electron transport layer and the second electrode. The electron transport layer may be adjacent (e.g., directly adjacent or directly disposed on) the light emitting layer. In an embodiment, the light emitting layer may contact the electron transport layer.

The metal oxide of the nanoparticles in the electron transport layer may include a zinc oxide. In an embodiment, the zinc oxide may include $Zn_{1-x}M_xO$ (wherein M is Mg, Ca, Zr, W, Li, Ti, Y, Al, or a combination thereof, and $0 \leq x \leq 0.5$). A value of x may be greater than 0, greater than or equal to about 0.01, greater than or equal to about 0.03, greater than or equal to about 0.05, greater than or equal to about 0.07, greater than or equal to about 0.1, greater than or equal to about 0.13, greater than or equal to about 0.15, greater than or equal to about 0.17, greater than or equal to about 0.2, greater than or equal to about 0.23, or greater than or equal to about 0.25. A value of x may be less than or equal to about 0.47, less than or equal to about 0.45, less than or equal to about 0.43, less than or equal to about 0.4, less than or equal to about 0.37, less than or equal to about 0.35, or less than or equal to about 0.3. The metal oxide (or the zinc oxide) may further include magnesium. The electron transport layer (or the zinc oxide) may include ZnO, $Zn_{1-x}M_xO$ (wherein, M is Mg, Ca, Zr, W, Li, Ti, Y, Ai, or a combination thereof, and $0 \leq x \leq 0.5$), or a combination thereof.

An average size of the metal oxide nanoparticles may be greater than or equal to about 1 nm, greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm. An average size of the metal oxide nanoparticles may be less than or equal to about 10 nm, less than or equal to about 8 nm, less than or equal to about 7 nm, less than or equal to about 6 nm, less than or equal to about 5 nm, or less than or equal to about 4.5 nm.

In an embodiment, the metal oxide nanoparticles (e.g., the zinc oxide nanoparticles) may be prepared in any proper method, which is not particularly limited. In an embodiment, the zinc oxide (e.g., zinc magnesium oxide) nanoparticle may be prepared by placing a zinc compound (e.g., an organic zinc compound such as zinc acetate dihydrate) and optionally an additional metal compound (e.g., an organic additional metal compound such as magnesium acetate tetrahydrate) in an organic solvent (e.g., dimethylsulfoxide) in a flask to have a desired mole ratio and heating the same at a predetermined temperature (e.g., from about 40° C. to about 120° C., or from about 60° C. to about 100° C.) (e.g., in air), and adding a precipitation accelerator solution (for example, a solution of tetramethyl ammonium hydroxide pentahydrate and ethanol) at a predetermined rate with, e.g., while, stirring. The prepared zinc oxide nanoparticle (e.g., $Zn_{1-x}Mg_xO$ nanoparticle) may be recovered from a reaction solution for example via centrifugation.

In an embodiment, a thickness of the electron transport layer may be greater than or equal to about 3 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 21 nm, greater than or equal to about 22 nm, greater than or equal to about 23 nm, greater than or equal to about 24 nm, greater than or equal to about 25 nm, greater than or equal to about 26 nm, greater than or equal to about 27 nm, greater than or equal to about 28 nm, greater than or equal to about 29 nm, greater than or equal to about 30 nm, greater than or equal to about 31 nm, greater than or equal to about 32 nm, greater than or equal to about 33 nm, greater than or equal to about 34 nm, or greater than or equal to about 35 nm. The thickness of the electron transport layer may be less than or equal to about 90 nm, less than or equal to about 80 nm, less than or equal to about 70 nm, less than or equal to about 60 nm, less than or equal to about 50 nm, less than or equal to about 45 nm, less than or equal to about 40 nm, or less than or equal to about 35 nm.

A device according to an embodiment as shown in FIG. 2, the device may have a normal structure. In an embodiment, in the device, the anode 10 disposed on the transparent substrate 100 may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS, a p-type metal oxide, or a combination thereof; a hole transport layer such as TFB, polyvinylcarbazole (PVK), or a combination thereof; or a combination thereof) may be provided between the transparent electrode 10 and the light emitting layer 30. The hole injection layer may be disposed close to the transparent electrode and the hole transport layer may be disposed close to the light emitting layer. The electron auxiliary layer 40 such as an electron injection/transport layer may be disposed between the light emitting layer 30 and the cathode 50.

A device according to another embodiment may have an inverted structure as depicted in FIG. 3. Herein, the cathode 50 disposed on the transparent substrate 100 may include a metal oxide-based transparent electrode (e.g., ITO), and the anode 10 facing the cathode may include a metal (e.g., having a relatively high work function, Au, Ag, etc.). For example, an (optionally doped) n-type metal oxide (crystalline Zn metal oxide) or the like may be disposed as an electron auxiliary layer 40 (e.g., an electron transport layer) between the transparent electrode 50 and the light emitting layer 30. $MoO_3$, an other p-type metal oxide, or a combination thereof may be disposed as a hole auxiliary layer 20 (e.g., a hole transport layer including TFB, PVK, or a combination thereof; a hole injection layer including $MoO_3$, an other p-type metal oxide, or a combination thereof; or a combination thereof) between the metal anode 10 and the light emitting layer 30.

The electroluminescent device of an embodiment may be configured to emit red light, blue light, or green light A wavelength range of the red light, blue light, or green light may be the same as described herein.

In an embodiment, the electroluminescent device may a maximum external quantum efficiency of greater than or equal to about 6%, greater than or equal to about 8%, greater than or equal to about 10%, greater than or equal to about 11%, greater than or equal to about 12%, greater than or equal to about 13%, greater than or equal to about 14%, or greater than or equal to about 15%. In an embodiment, the electroluminescent device may a maximum external quantum efficiency of 100%, less than or equal to about 90%, less than or equal to about 80%, less than or equal to about 70%, less than or equal to about 60%, less than or equal to about 50%, less than or equal to about 40%, less than or equal to about 30%, or less than or equal to about 20%.

In an embodiment, the electroluminescent device may exhibit an improved lifespan. In an embodiment, as measured by driving the device at a predetermined luminance (for example, about 100 nit to about 3,000 nit, about 200 nit to about 2,800 nit, about 400 nit to about 2,600 nit, about 600 nit to about 2,500 nit, about 650 nit to about 2,000 nit, or a combination thereof) the electroluminescent device may have a T50 of greater than or equal to about 50 hours, greater than or equal to about 60 hours, greater than or equal to about 70 hours, greater than or equal to about 80 hours, greater than or equal to about 90 hours, greater than or equal to about 100 hours, greater than or equal to about 105 hours, greater than or equal to about 110 hours, greater than or equal to about 115 hours, or greater than or equal to about 120 hours. The T50 may be 2,000 hours, less than or equal to about 1,500 hours, less than or equal to about 1,000 hours, less than or equal to about 500 hours, less than or equal to about 300 hours, less than or equal to about 200 hours, or less than or equal to about 150 hours.

In an embodiment, the electroluminescent device may exhibit a delta voltage at T50 of less than about 1 volts, for example, less than or equal to about 0.9 volts, less than or equal to about 0.8 volts, less than or equal to about 0.7 volts, less than or equal to about 0.6 volts, less than or equal to about 0.5 volts, less than or equal to about 0.4 volts, less than or equal to about 0.3 volts, less than or equal to about 0.2 volts, or less than or equal to about 0.1 volts. The electroluminescent device may exhibit a delta voltage at T50 of greater than or equal to about 0 volts, greater than or equal to about 0.01 volts, greater than or equal to about 0.05 volts, or greater than or equal to about 0.1 volts.

In an embodiment, the electroluminescent device may exhibit a maximum luminance of greater than or equal to about 50,000 nit, greater than or equal to about 60,000 nit, greater than or equal to about 70,000 nit, greater than or equal to about 80,000 nit, greater than or equal to about 90,000 nit, or greater than or equal to about 100,000 nit. In an embodiment, the electroluminescent device may exhibit a maximum luminance of about 50,000 nit ($cd/m^2$) to about 10,000,000 nit, about 65,000 nit to about 5,000,000 nit, about 70,000 nit to about 3,000,000 nit, about 75,000 nit to about 1,500,000 nit, about 80,000 nit to about 1,000,000 nit, about 90,000 nit to about 900,000 nit, about 100,000 nit to about 950,000 nit, about 150,000 nit to about 850,000 nit, about 200,000 nit to about 700,000 nit, about 250,000 nit to about 650,000 nit, about 300,000 nit to about 600,000 nit, or a combination thereof.

In an embodiment, a method of producing the electroluminescent device includes forming a light emitting layer on the first electrode, forming the electron auxiliary layer on the light emitting layer, and forming the second electrode on the electron auxiliary layer.

In an embodiment, the electroluminescent device may be manufactured by optionally forming a hole auxiliary layer (e.g., by deposition or coating) on a substrate on which an electrode is disposed, forming a light emitting layer including nanoparticle (e.g., a pattern of the aforementioned nanoparticle), and forming (optionally, an electron auxiliary layer and) an electrode (e.g., by vapor deposition or coating) on the light emitting layer. A method of forming the electrode/hole auxiliary layer/electron auxiliary layer may be appropriately selected and is not particularly limited.

In an embodiment, the forming of the light emitting layer may include preparing a film including semiconductor nanoparticles, and contacting the semiconductor nanoparticles with a cyanide solution. The cyanide solution may be prepared by dissolving a cyanide compound described herein (e.g., an inorganic cyanide) in a solvent (e.g., water or an organic solvent). The cyanide solution may include a cyanide anion and a cation derived from the cyanide compound.

The forming of the film may be performed by obtaining a composition including nanoparticles (configured to emit desired light) and applying or depositing the composition on a substrate or charge auxiliary layer in an appropriate manner (e.g., by spin coating, inkjet printing, etc.).

In an embodiment, the semiconductor nanoparticles may (make) contact with the cyanide solution, and then is applied or deposited on the electrode or the charge auxiliary layer. When the semiconductor nanoparticles are contacted with the cyanide solution, a control of an amount of the cyanide solution may be made to maintain the dispersibility of the semiconductor nanoparticles in a contacting medium.

In an embodiment, the formation of the light emitting layer may include preparing a film including semiconductor nanoparticles, preparing the cyanide solution, applying the cyanide solution on the film, and removing the cyanide solution from the film.

In an embodiment, the film including the semiconductor nanoparticles (hereinafter, light emitting film) may be formed by obtaining a coating liquid including semiconductor nanoparticles and an organic solvent (e.g., an alkane solvent such as octane, heptane, or the like, an aromatic solvent such as toluene, or a combination thereof) and applying or depositing the coating liquid on a substrate or charge auxiliary layer (e.g., a hole auxiliary layer) in an appropriate manner (e.g., by spin coating, inkjet printing, etc.). A type of the organic solvent for the coating liquid is not particularly limited and may be selected appropriately. In an embodiment, the organic solvent may include a substituted or unsubstituted aliphatic hydrocarbon, a substituted or unsubstituted aromatic hydrocarbon, a substituted or unsubstituted alicyclic hydrocarbon, an acetate solvent, or a combination thereof.

The cyanide compound may include an alkali metal cyanide, an ammonium salt cyanide, a hydrogen cyanide, or a combination thereof.

The cyanide compound may include potassium cyanide (KCN), sodium cyanide (NaCN), lithium cyanide (LiCN), rubidium cyanide (RbCN), cesium cyanide (CsCN), a tetraalkyl ammonium salt cyanide, or a combination thereof. The cyanide compound may be a soluble salt that may be dissolved in an appropriate solvent (e.g., an organic solvent).

The organic solvent for forming the cyanide compound may be selected depending on the type of the cyanide compound. The organic solvent may include a C1 to C10 alcohol, a C2 to C10 nitrile solvent such as acetonitrile, or a combination thereof. The cyanide compound may be dissolved in the organic solvent to provide an (organic) solution (e.g., a cyanide solution). A concentration of the cyanide compound in the cyanide solution may be selected appropriately taking into consideration a solubility of the compound, a desired substitution ratio, or the like.

The contacting between the semiconductor nanoparticles and the cyanide solution in the medium may be carried out in a medium (e.g., prior to the formation of the light emitting film), a concentration of the cyanide solution in the medium may be controlled to maintain the dispersibility of the semiconductor nanoparticles.

A concentration of the cyanide solution may be, based on a total weight of the solution, greater than or equal to about 0.0001 weight percent (wt %), greater than or equal to about 0.0005 wt %, greater than or equal to about 0.001 wt %, greater than or equal to about 0.005 wt %, greater than or equal to about 0.01 wt %, greater than or equal to about 0.05 wt %, greater than or equal to about 0.1 wt %, greater than or equal to about 0.5 wt %, or greater than or equal to about 1 wt %. A concentration of the cyanide solution may be, based on a total weight of the solution, less than or equal to about 10 wt %, less than or equal to about 9 wt %, less than or equal to about 8 wt %, less than or equal to about 7 wt %, less than or equal to about 5 wt %, less than or equal to about 4 wt %, less than or equal to about 3 wt %, less than or equal to about 2 wt %, less than or equal to about 1 wt %, or less than or equal to about 0.5 wt %.

In an embodiment, the cyanide solution and the semiconductor nanoparticle dispersion may be mixed at a suitable ratio, which may be selected taking into consideration a desired substitution degree and the dispersibility, and is not particularly limited. A volume or weight ratio of the semiconductor nanoparticle dispersion and the cyanide solution may be about 1:0.0001 to about 1:10,000, about 1:0.001 to about 1:1,000, about 1:0.01 to about 1:100, about 1:0.1 to about 1:10, about 1:0.5 to about 1:5, about 1:0.8 to about 1:1.2, or a combination thereof.

In an embodiment, the cyanide solution may be applied to the light emitting film. The application of the cyanide solution to the light emitting film is not particularly limited and selected appropriately. In an embodiment, a predetermined amount of the cyanide solution may be coated on the light emitting film (for example, by a spin-coating, a blade coating, a deposition, or a dropping) or the light emitting film may be dipped in the cyanide solution.

The applied cyanide solution may be kept for a predetermined time. The keeping time is not particularly limited and may be greater than or equal to about 1 second, greater than or equal to about 5 seconds, greater than or equal to about 10 seconds, greater than or equal to about 30 seconds, greater than or equal to about 1 minute, greater than or equal to about 3 minutes, greater than or equal to about 5 minutes, greater than or equal to about 7 minutes, greater than or equal to about 9 minutes, greater than or equal to about 10 minutes, greater than or equal to about 30 minutes, greater than or equal to about 50 minutes, or greater than or equal to about 1 hour. The keeping time may be less than or equal to about 2 hours, less than or equal to about 90 minutes, less than or equal to about 70 minutes, less than or equal to about 50 minutes, less than or equal to about 30 minutes, less than or equal to about 10 minutes, less than or equal to about 5 minutes, less than or equal to about 1 minute. Without wishing to be bound by any theory, it is believed that the cyanide compound may react with a surface of the semiconductor nanoparticle included in the light emitting film and at least a portion of the ligand present on the surface of the semiconductor nanoparticle may be replaced with the cyanide moiety or the cyanide compound may be dissociated with a cation and an anion and the anion may be bond to the semiconductor nanoparticle.

The method may further include removing the cyanide compound from the light emitting layer onto which the cyanide solution is applied. The removal of the cyanide compound may include washing the treated light emitting layer with the organic solvent. Without wishing to be bound by any theory, it is believed that by the washing, the unreacted cyanide compound or the anion of the cyanide compound may be remove from the light emitting film.

In an embodiment, the light emitting film optionally washed or the light emitting layer may be heat-treated. The temperature and the time of the heat-treating are not particularly limited and selected appropriately. A temperature of the heat treating may be greater than or equal to about 40° C., greater than or equal to about 50° C., greater than or equal to about 60° C., greater than or equal to about 70° C., greater than or equal to about 80° C., greater than or equal to about 90° C., greater than or equal to about 100° C., greater than or equal to about 120° C., greater than or equal to about 130° C., greater than or equal to about 140° C., greater than or equal to about 150° C., greater than or equal to about 160° C., greater than or equal to about 170° C., greater than or equal to about 180° C., greater than or equal to about 190° C., or greater than or equal to about 200° C. A temperature of the heat treating may be less than or equal to about 250° C., less than or equal to about 230° C., less than or equal to about 200° C., less than or equal to about 180° C., less than or equal to about 160° C., less than or equal to about 140° C., less than or equal to about 120° C., less than or equal to about 100° C., less than or equal to about 80° C., less than or equal to about 60° C., less than or equal to about 50° C., or less than or equal to about 45° C. The heat-treating time may be greater than or equal to about 1 minutes, greater than or equal to about 3 minutes, or greater than or equal to about 5 minutes and less than or equal to about 2 hours, less than or equal to about 1 hour, or less than or equal to about 30 minutes.

An electron auxiliary layer may be disposed on the light emitting layer. The electron auxiliary layer includes an electron transport layer. Formation of the electron auxiliary layer is not particularly limited. In an embodiment, the electron auxiliary layer may be formed via a vapor deposition. In an embodiment, the electron auxiliary layer may include a zinc oxide. In an embodiment, the electron auxiliary layer may be prepared by using a solution process. In an embodiment, the electron auxiliary layer (e.g., the electron transport layer) may be prepared by obtaining a dispersion and applying the dispersion to form a film, wherein in the dispersion, a plurality of metal oxide nanoparticles is dispersed in an organic solvent (e.g., a polar organic solvent, a non-polar organic solvent, or a combination thereof). The dispersion may be applied onto the light emitting layer. The solution process may further include removing the organic solvent from the formed film for example by evaporation. The organic solvent may include a C1 to C10 alcohol solvent or a combination thereof.

In an embodiment, a display device includes the electroluminescent device described herein.

The display device may include a first pixel and a second pixel that is configured to emit light different from, e.g., a different colored light than, the first pixel. The first pixel, the second pixel, or a combination thereof may include the electroluminescent device of an embodiment.

The display device or an electronic apparatus may include (or may be) a television, a virtual reality/augmented reality (VR/AR), a handheld terminal, a monitor, a notebook computer, an electronic display board, a camera, or a part for an automatic, e.g., autonomous, vehicle.

Specific examples are described below. However, the examples described below are only for specifically illustrating or explaining the disclosure, and the scope of the disclosure is not limited thereto.

EXAMPLES

1. Electroluminescence Measurement

A current according to an applied voltage is measured with a Keithley 2635B source meter, and a CS2000 spectrometer is used to measure electroluminescent properties (e.g., luminance) of a light-emitting device.

2. Lifespan Characteristics

T90: The time (hr) for the brightness of a device driven (operated) at a predetermined brightness to decrease to 90% of the initial brightness (100%).

3. Fourier Transform Infrared (FTIR) Spectroscopy Analysis

FTIR spectroscopy analysis is conducted using Varian 670-IR with Miracle accessory.

4. Photoluminescence Analysis

Photoluminescence (PL) spectroscopy analysis is conducted using a Hitachi F-7000 spectrophotometer.

5. X Ray Photoelectron Spectroscopy (XPS) Analysis

Photoluminescence (PL) spectroscopy analysis is conducted using a Hitachi F-7000 spectrophotometer.

The following synthesis is performed under an inert gas atmosphere (e.g., under nitrogen) unless otherwise specified. A precursor content is provided as a molar content, unless otherwise specified.

Synthesis Example 1

A Se/trioctylphosphine (TOP) stock solution, a S/TOP stock solution, and a Te/TOP stock solution are prepared by dispersing selenium (Se), sulfur (S), and tellurium (Te) in trioctylphosphine (TOP), respectively. In a reactor containing trioctylamine, 0.125 millimoles (mmol) of zinc acetate is added to the reactor with oleic acid and heated at 120° C. under vacuum. After 1 hour, nitrogen is introduced into the reactor.

The reactor is heated to 300° C., and the Se/TOP stock solution and the Te/TOP stock solution in a Te:Se mole ratio of 1:20 are rapidly injected into, e.g., added to, the reactor. When the reaction is complete, the reaction solution is rapidly cooled to room temperature and acetone is added to the reactor. The resulting product mixture is centrifuged and the formed precipitate is separated and dispersed in toluene to prepare a ZnSeTe core particle.

Amounts of 1.8 mmol of zinc acetate and oleic acid are added to a flask containing trioctylamine and the prepared mixture is heated at 120° C. under vacuum for 10 minutes. Nitrogen ($N_2$) is then introduced into the reactor, which is heated to 180° C., and the prepared ZnTeSe core particles are added quickly to the reactor and the Se/TOP stock solution and the S/TOP stock solution are injected thereinto, as well. At a reaction temperature of about 280° C., the reaction is carried out. When the reaction is complete, the reactor is cooled to room temperature and ethanol is added to facilitate precipitation of the semiconductor nanoparticles, which are separated by centrifuge and dispersed in octane to prepare an octane dispersion. The PL analysis was conducted to confirm that the semiconductor nanoparticles emitted blue light.

Synthesis Example 2: Synthesis of ZnMgO Nanoparticles

Zinc acetate dihydrate and magnesium acetate tetrahydrate are added into a reactor including dimethylsulfoxide to provide a mole ratio according to the following chemical formula and heated at 60° C. in an air atmosphere. Subsequently, a solution of tetramethylammonium hydroxide pentahydrate and ethanol is added into the reactor in a dropwise fashion at a speed of 3 milliliters per minute (mL/min). After stirring the mixture, the prepared nanoparticles are centrifuged and dispersed in ethanol to provide an ethanol dispersion of $Zn_{1-}Mg_xO$ (x=0.15) nanoparticles.

The prepared nanoparticles are analyzed by a transmission electron microscopic analysis, and the results show that the particles have an average particle size of about 3 nm.

Experimental Example 1

Zinc chloride (Cas Number 7646-85-7), KCN (Cas No. 151-50-8) and NaCN (Cas No. 143-33-9) are dissolved to provide a $ZnCl_2$ solution (1 weight percent (wt %)), a KCN solution (0.1 wt %), and a NaCN solution (0.1 wt %).

On a Si wafer, a dispersion of the semiconductor nanoparticles prepared in Synthesis Example 1 is applied and a solvent is removed therefrom to form a film (ref.).

On the formed film, each of a $ZnCl_2$ solution, a KCN solution, or a NaCN solution is spin coated respectively, and each of the resulting films is washed with ethanol, and optionally heat-treated (hereinafter, a spin and dry treatment, SPD).

Figure 4A:
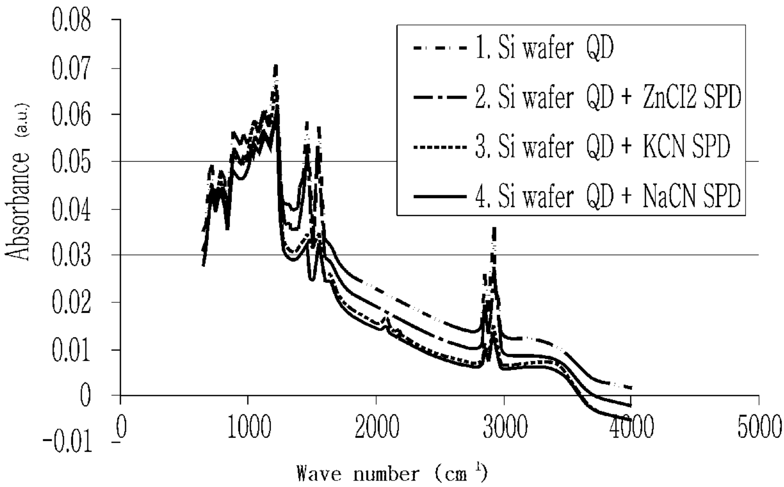
FIG. 4A is a graph of Absorbance (arbitrary units (a.u.)) versus Wave number ($cm^{-1}$) showing the results of a Fourier transform infrared spectroscopy (FTIR) for the light emitting layers of the Reference Example, Examples 1 and 2, and the Comparative Example.

For the prepared films, a FTIR spectroscopy analysis is carried out and the results are shown in FIG. 4A.

Figure 4B:
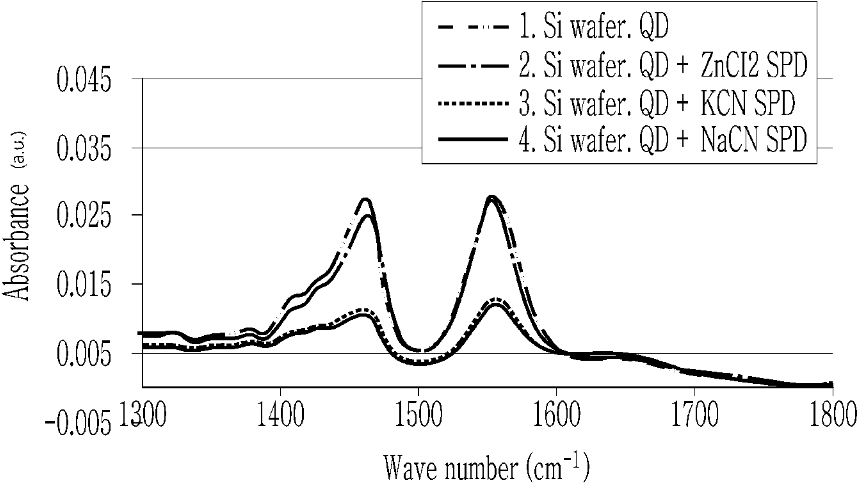
FIG. 4B is a graph of Absorbance (a.u.) versus Wave number ($cm^{-1}$) showing changes in the normalized intensities for the peaks of the COO moiety in the FTIR spectrum of FIG. 4A.
Figure 4C:
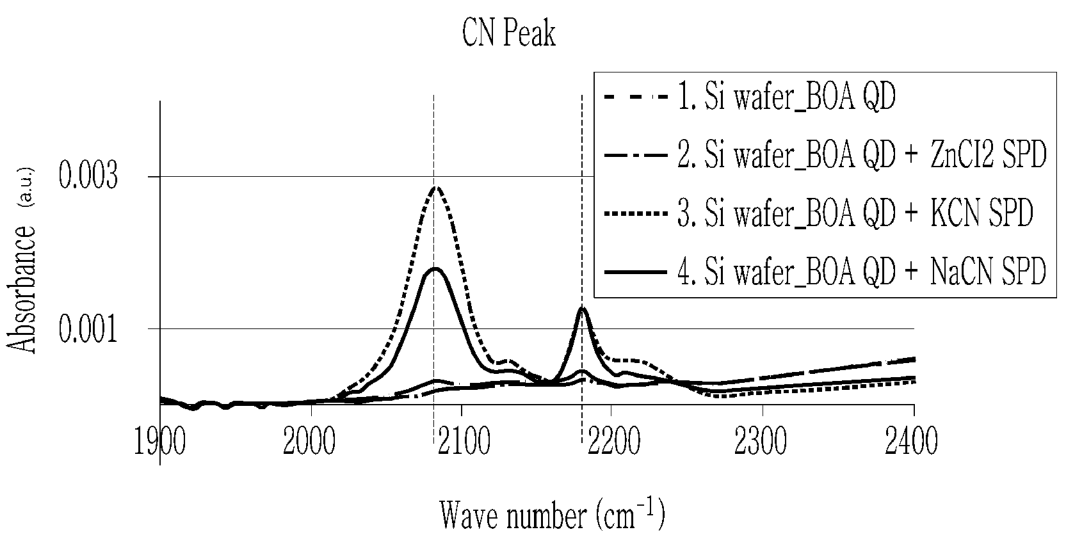
FIG. 4C is a graph of Absorbance (a.u.) versus Wave number ($cm^{-1}$) showing changes in the normalized intensities for the peaks of the CN moiety in the FTIR spectrum of FIG. 4A.

Based on the flat line in a wavenumber range of about 1,800 inverse centimeters ($cm^{-1}$) to about 2,700 $cm^{-1}$, a data processing program (e.g., Excel) is used to normalize the peaks assigned to the COO moiety and the peaks assigned to the CN moiety, and the results are shown in FIG. 4B and FIG. 4C.

From the results of FIG. 4A, FIG. 4B, and FIG. 4C, in case of the treated light emitting layer, the intensities of the peaks assigned to the carboxylic acid moiety (e.g., in wavenumber range of about 1,400 $cm^{-1}$ to about 1,600 $cm^{-1}$) are significantly reduced and the peaks assigned to the CN moiety are observed in a wavenumber range of from about 1,950 $cm^{-1}$ to about 2,200 $cm^{-1}$.

In FIG. 4C, the first peak appearing at a wavenumber of about 2,080 $cm^{-1}$ may be assigned to the $CN^-$ and the second peak appearing at a wavenumber of about 2180 $cm^{-1}$ may be assigned to a Zn—CN compound.

With respect to the intensity of the peaks appearing at a wavenumber range of about 1,400 $cm^{-1}$ to about 1,500 $cm^{-1}$, (i.e., the absorbance of the COO moiety at about 1,465 $cm^{-1}$, in FIG. 4B, a ratio of the absorbance of the first peak or the second peak in FIG. 4C is calculated, respectively.

In case of the NaCN treated film, the calculated ratios are 0.2 (=0.002/0.01) and 0.11 (=0.0011/0.01), and in case of the KCN treated film, the calculated ratios are about 0.29 (=0.0029/0.01) and about 0.11 (=0.0011/0.01), respectively.

Example 1

A light emitting device having a structure of indium tin oxide (ITO)/poly(3,4-ethylenedioxythiophene) polystyrene sulfonate (PEDOT:PSS) (300 angstrom thickness)/poly(9,9-dioctyl-fluorene-co-N-(4)-butylphenyl)-diphenylamine) (TFB) (250 angstrom thickness)/semiconductor nanoparticle light emitting layer (400 angstrom thickness)/ZnMgO (200 angstrom thickness)/AI (1,000 angstrom thickness).

On a glass substrate deposited with indium tin oxide (ITO, a first electrode) are spin-coated a poly(3,4-ethylenedioxythiophene) polystyrene sulfonate (PEDOT:PSS) (H.C. Starks) as a hole injection layer (HIL) and poly[(9,9-dioctylfluorenyl-2,7-diyl-co(4,4'-(N-4-butylphenyl)diphenylamine]solution (TFB) (Sumitomo) as a hole injection layer (thickness of 25 nm). The dispersion of the semiconductor nanoparticles prepared from Synthesis Example 1 is spin-coated on the prepared TFB layer to prepare a light emitting film.

The light emitting film is treated with the KCN solution in the same manner as in Experimental Example 1. On the treated light emitting layer, the zinc magnesium oxide nanoparticle layer is formed as an electron auxiliary layer (e.g., an electron transporting layer), and then aluminum (Al) is deposited under vacuum on the prepared electron transport layer to prepare a second electrode, providing an electroluminescent device.

Electroluminescent properties of the prepared device are measured and the results are shown in Table 1.

Figure 5:
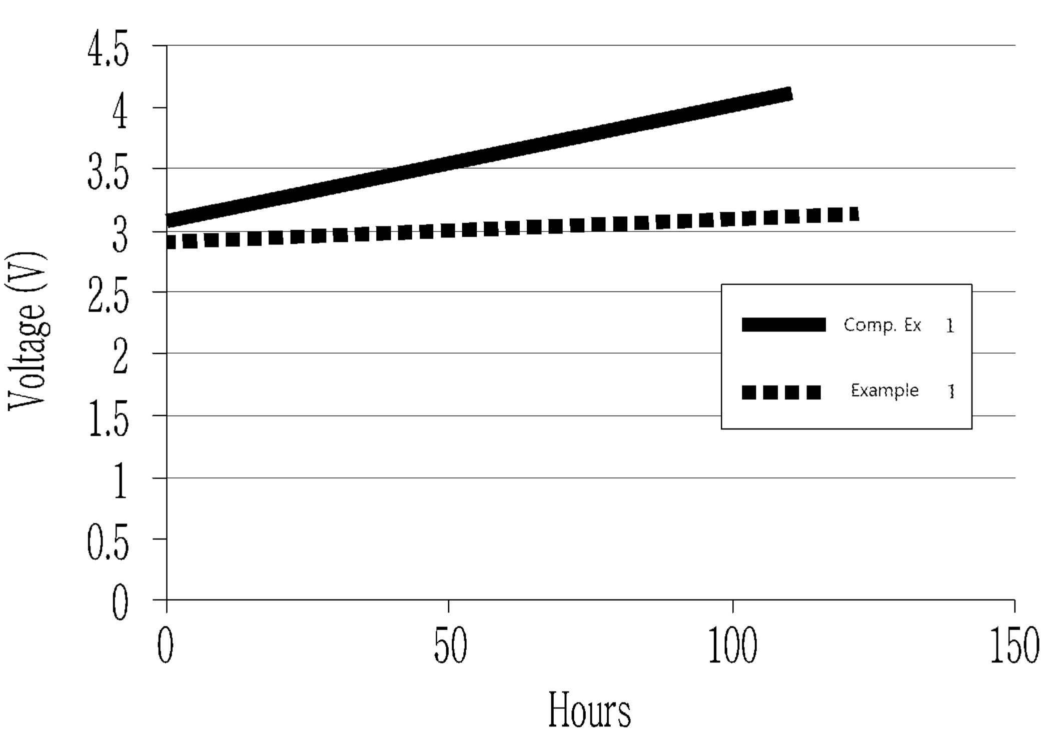
FIG. 5 is a graph of Voltage (volts (V)) versus Time (Hours) showing a life span evaluation based on a voltage difference for the electroluminescent devices of Example 1 and Comparative Example 1.

Lifetime properties of the prepared device are measured and the results are shown in Table 2 and FIG. 5.

Example 2

An electroluminescent device is prepared in the same manner as Example 1 except that the NaCN solution is used instead of the KCN solution. For the prepared device, electroluminescent properties are measured and the results are shown in Table 1.

Comparative (Comp.) Example 1

An electroluminescent device is prepared in the same manner as Example 1 except that the $ZnCl_2$ solution is used instead of the KCN solution. For the prepared device, electroluminescent properties are measured and the results are shown in Table 1. Lifetime properties of the prepared device are measured and the results are shown in Table 2 and FIG. 5.

TABLE 1

| | Maximum external quantum efficiency (EQE) (%) | Max Luminance (nit) |
|---|---|---|
| Example 1 | 13% | 84,000 |
| Example 2 | 13% | 85,000 |
| Comp. Example 1 | 4% | 48,000 |

TABLE 2

| | T50 (hour) | A voltage difference (delta voltage) at T50 |
|---|---|---|
| Example 1 | about 130 hours | about 0.2 volts |
| Comp. Example 1 | about 100 hours | about 1 volts |

The results of Table 1, Table 2, and FIG. 5 confirm that the electroluminescent devices of Examples 1 and 2 show, e.g., exhibit, both significantly improved luminescent properties and lengthened, e.g., increased, lifespan, in comparison with the electroluminescent device of Comparative Example 1.

Comparative Example 2

An electroluminescent device is prepared in the same manner as Example 1 except that the KCN solution is not used. For the prepared device, electroluminescent properties are measured and the results confirm that the electroluminescent properties of the device of Comparative Example 2 is significantly lower than the devices of Examples 1 and 2 (i.e., 1/10 of EQE and 1/12 Luminance in comparison with the device of Example 1). Lifetime properties of the prepared device are measured and the results confirm that the T50 is less than 1 hour.

Experimental Example 2: Production of an Electron Only Device (EOD) and a Hole Only Device (HOD)

The EOD having a structure of ITO (150 nm thickness)/ZnMgO (30 nm thickness)/QD (i.e., semiconductor nanoparticles)/ZnMgO (30 nm thickness)/Al (100 nm thickness) is prepared by a spin coating method. The HOD having ITO (150 nm thickness)/PEDOT:PSS (30 nm thickness)/TFB (25 nm thickness)/QD/4,4',4"-tis(N-carbazolyl)-triphenylamine (TCTA) (36 nm thickness)/hexaazatriphenylene-hexacarbonitrile (HATCN) (10 nm thickness)/Ag (100 nm thickness) is also prepared. The formation of the hole injection layer and the hole transporting layer is made by using a vapor deposition. The formation of the electron transporting layer and the light emitting layer are the same as Example 1.

The QD layer (i.e., the light emitting layer) is treated with the KCN solution (0.1 wt %) or the $ZnCl_2$ (1 wt %) or untreated (Reference Example).

Figure 6:
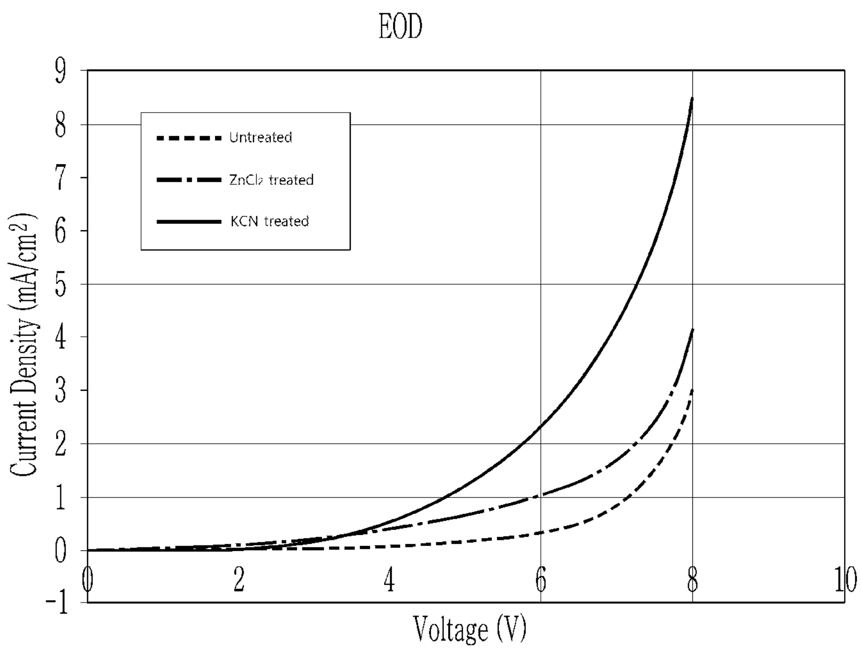
FIG. 6 is a graph of Current Density (milliamperes per square centimeter ($mA/cm^2$)) versus Voltage (V) showing evaluation results of an electron only device (EOD) for an untreated light emitting layer and light emitting layers treated with KCN solution and $ZnCl_2$ solution.
Figures 7, 8:
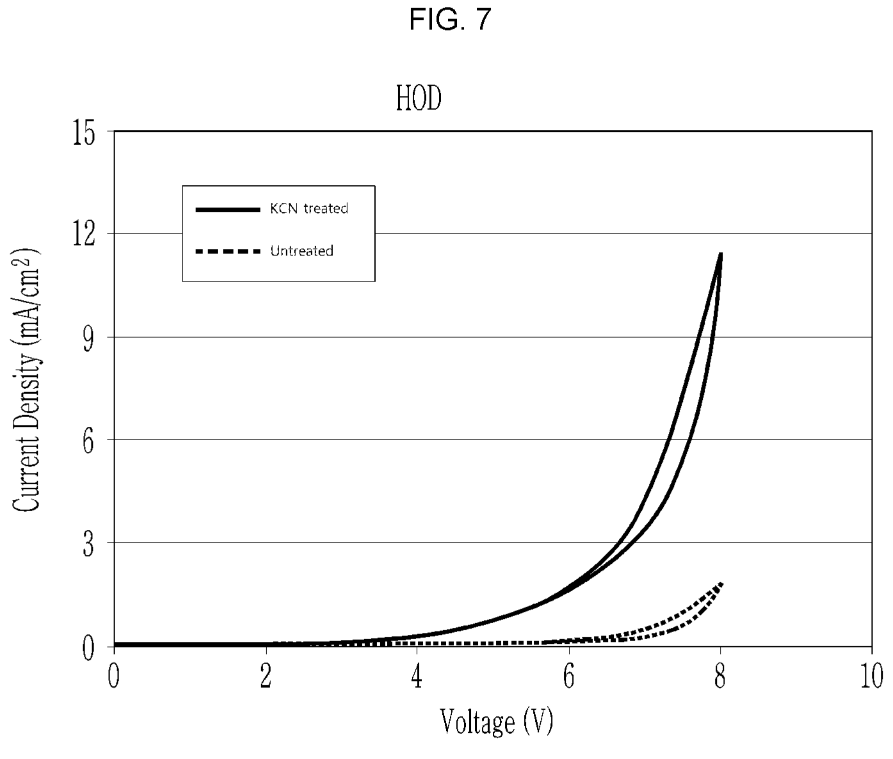
FIG. 7 is a graph of Current Density ($mA/cm^2$) versus Voltage (V) showing evaluation results of a hole only device (HOD) for an untreated light emitting layer and a light emitting layer treated with KCN solution.
FIG. 8 is a graph of standardized photoelectron yield ratio per unit of ultraviolet (UV) energy applied ((Yield)^0.33) (counts per second (cps)) versus Energy (eV) showing AC-3 evaluation results for an untreated light emitting layer and a light emitting layer treated with KCN solution.

For each of the prepared devices, a voltage of from about 0 volts (V) to 8 volts is applied and a current density (milliamperes per square centimeter ($mA/cm^2$)) is measured to evaluate the HT (hole transporting) property and the ET (electron transporting) property, and the results are shown in Table 3, Table 4, and FIG. 6 and FIG. 7.

TABLE 3

(ET)

| | Current density at 5 V | Current density at 8 V | Relative ET at 8 V |
|---|---|---|---|
| untreated | 0.17 $mA/cm^2$ | 2.99 $mA/cm^2$ | 100% |
| KCN solution treated | 1.22 $mA/cm^2$ | 8.49 $mA/cm^2$ | 284% |
| $ZnCl_2$ solution treated | 0.78 $mA/cm^2$ | 4.59 $mA/cm^2$ | 153% |

TABLE 4

(HT)

| | Current density at 5 V | Current density at 8 V | Relative HT at 8 V |
|---|---|---|---|
| untreated | 0.01 $mA/cm^2$ | 2 $mA/cm^2$ | 100% |
| KCN solution treated | 0.33 $mA/cm^2$ | 12.1 $mA/cm^2$ | 613% |
| $ZnCl_2$ solution treated | 0.22 $mA/cm^2$ | 18.4 $mA/cm^2$ | 932% |

The results of Table 3 and 4 confirm that the KCN treated light emitting layer exhibited improved ET and HT and a balance (HT/ET) therebetween (HT/ET=1.4) may be maintained at a desired level (e.g., less than 4).

Experimental Example 3: Highest Occupied Molecular Orbital (HOMO) Level Measurement Using AC-3 photoelectron spectrophotometer in Air (Riken Keiki Co. Ltd.), the HOMO for each of the light emitting layer treated with the KCN solution and the untreated light emitting layer is measured. The results are shown in FIG. 8.

For the ETL, an UPS (UV absorption (Optical band-gap)) is used to measure the lowest unoccupied molecular orbital (LUMO) level. The ZnMgO layer has the LUMO level of about 3.6 electronvolts (eV).

The results are shown in Table 5.

TABLE 5

| | HOMO Level (eV) | LUMO Level (eV) | A LUMO level difference between the ETL and the light emitting layer |
|---|---|---|---|
| KCN treated | 5.80 | 3.0 eV | 0.6 eV |
| untreated | 5.45 | 2.7 eV | 0.9 eV |

Experimental Example 4: Photoluminescence Characterization

The KCN treated light emitting layer and the $ZnCl_2$ treated light emitting layer are irradiated with a light source of a wavelength of 400 nm to evaluate photoluminescence properties thereof. The results confirm that the KCN treated light emitting layer exhibits a photoluminescence intensity that is about 1/5 of the intensity of the untreated light emitting layer.

The luminescent device of Example 1 and the luminescent device of Comparative Example 1 are irradiated with a light source of a wavelength of 400 nm to evaluate photoluminescence properties thereof. The results confirm that the exhibit an intensity that is about 1/5 of the intensity of the untreated light emitting layer. The results confirm that the light emitting device of Example 1 exhibits a photoluminescence intensity that is about 1/2 of the intensity of the device of Comparative Example 1.

The foregoing results confirm that the KCN solution treated light emitting layer may exhibit a reduced photoluminescence, and thus the light emitting device of Example 1 show a significantly improved electroluminescent properties in comparison with the device of Comparative Example 1 and PL properties thereof may decrease. Therefore, when being produced as a display panel in the same manner, the display panel including the light emitting device of the Examples may suppress, reduce, or a combination thereof the external light reflection more effectively than the display panel including the light emitting device of the comparative Examples.

Experimental Example 5

For the light emitting layer of Example 1 and the light emitting layer of Comparative Example 2, an XPS analysis is conducted and the results are shown in Table 6.

TABLE 6

| | C:Zn (mole ratio) |
|---|---|
| Example 1 | 2.5:1 |
| Comparative Example 2 | 4.3:1 |

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A method of producing an electroluminescent device, wherein the electroluminescent device comprises:

a first electrode;

a second electrode; and a light emitting layer disposed between the first electrode and the second electrode, wherein the light emitting layer comprises a plurality of semiconductor nanoparticles and does not comprise cadmium, wherein the light emitting layer further comprises a cyanide anion, a chemical species comprising a cyanide moiety, or a combination thereof wherein the chemical species comprises a bond between a metal and the cyanide moiety, wherein the light emitting layer further comprises a chemical species comprising a COO moiety, wherein the method comprises:

forming the light emitting layer on the first electrode, and forming the second electrode on the light emitting layer, wherein forming the light emitting layer comprises preparing a film comprising semiconductor nanoparticles, and contacting the semiconductor nanoparticles with a solution of a cyanide compound, and wherein the cyanide compound comprises potassium cyanide, sodium cyanide, lithium cyanide, rubidium cyanide, cesium cyanide, a tetraalkyl ammonium salt cyanide, or a combination thereof.

2. The method of claim 1, wherein the electroluminescent device further comprises an electron auxiliary layer disposed between the light emitting layer and the second electrode, wherein the electron auxiliary layer is configured to inject, transport or inject and transport an electron, or wherein the electroluminescent device further comprises a hole auxiliary layer between the light emitting layer and the first electrode.

3. The method of claim 1, wherein the light emitting layer comprises an alkali metal cyanide, an ammonium salt cyanide, a hydrogen cyanide, a cyanide group derived therefrom, or a combination thereof.

4. The method of claim 1, wherein the semiconductor nanoparticle comprises a Group II-VI compound, a Group III-V compound, a Group IV-VI compound, a Group IV element or compound, a Group I-III-VI compound, a Group II-III-VI compound, a Group I-II-IV-VI compound, or a combination thereof.

5. The method of claim 1, wherein the semiconductor nanoparticle has a size of greater than or equal to about 2 nanometers and less than or equal to about 50 nanometers.

6. The method of claim 1, wherein the light emitting layer exhibits at least one peak assigned to a cyanide group in a wavenumber range of about 1,900 inverse centimeters and about 2,300 inverse centimeters in a Fourier transform infrared spectroscopy analysis.

7. The method of claim 6, wherein the peak assigned to the cyanide group comprises a first peak, a second peak, or a combination thereof, wherein the first peak is present in a wavenumber range of 2,000 inverse centimeters to 2,150 inverse centimeters, and the second peak is present in a wavenumber range of 2,100 inverse centimeters to 2,300 inverse centimeters.

8. The method of claim 1, wherein the light emitting layer exhibits a peak assigned to a COO moiety in a wavenumber range of about 1,400 inverse centimeters to about 1,650 inverse centimeters in a Fourier transform infrared spectroscopy analysis, and wherein a ratio of a normalized intensity of the peak assigned to a cyanide group to a normalized intensity of the peak assigned to the COO moiety is greater than or equal to about 0.03:1 and less than or equal to about 1:1.

9. The method of claim 1, wherein the plurality of semiconductor nanoparticles comprises a zinc chalcogenide, the plurality of semiconductor nanoparticles further comprises an organic ligand, and in the plurality of semiconductor nanoparticles a mole ratio of carbon to zinc is greater than or equal to about 1.5:1 and less than or equal to about 4:1.

10. The method of claim 1, wherein the electroluminescent device further comprises an electron auxiliary layer disposed between the light emitting layer and the second electrode, and a difference between a lowest unoccupied molecular orbital energy level of the light emitting layer and a lowest unoccupied molecular orbital energy level of the electron auxiliary layer is greater than or equal to about 0.001 electronvolts and less than or equal to about 0.9 electronvolts.

11. The method of claim 1, wherein the electroluminescent device has a maximum external quantum efficiency of greater than or equal to about 10% or a maximum luminance of greater than or equal to about 50,000 candelas per square meter.

12. The method of claim 1, wherein the electroluminescent device exhibits a T50 of greater than or equal to about 50 hours, as measured by operating the device at 650 candelas per square meter, or wherein the electroluminescent device exhibits a voltage difference between an initial voltage and a voltage at T50 of less than 1 volt.

13. The method of claim 1, wherein the contacting is carried out by applying the solution of the cyanide compound on the film comprising semiconductor nanoparticles.

14. The method of claim 1, wherein the cyanide compound comprises potassium cyanide, sodium cyanide, or a combination thereof.

* * * * *